(12) United States Patent
Kato

(10) Patent No.: US 8,010,045 B2
(45) Date of Patent: Aug. 30, 2011

(54) SEMICONDUCTOR DEVICE

(75) Inventor: Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1027 days.

(21) Appl. No.: 11/885,589

(22) PCT Filed: Mar. 16, 2006

(86) PCT No.: PCT/JP2006/305755
§ 371 (c)(1),
(2), (4) Date: Sep. 4, 2007

(87) PCT Pub. No.: WO2006/103997
PCT Pub. Date: Oct. 5, 2006

(65) Prior Publication Data
US 2008/0137780 A1   Jun. 12, 2008

(30) Foreign Application Priority Data

Mar. 25, 2005   (JP) ................................ 2005-088027

(51) Int. Cl.
*H04B 5/00* (2006.01)
*H04B 1/06* (2006.01)
*H04B 7/00* (2006.01)
*H04B 1/16* (2006.01)
*H04M 1/00* (2006.01)

(52) U.S. Cl. ...... 455/39; 455/41.1; 455/269; 455/343.1; 455/558

(58) Field of Classification Search ........ 455/41.1–41.3, 455/269–279.1, 343.1–343.5, 299, 333, 558; 340/10.5, 14.61–14.62, 14.65, 825.65, 825.98
See application file for complete search history.

(56) References Cited

U.S. PATENT DOCUMENTS

| | | | |
|---|---|---|---|
| 5,825,299 A | 10/1998 | Fuentes et al. | |
| 5,847,662 A * | 12/1998 | Yokota et al. | ............... 340/10.34 |
| 6,806,783 B2 * | 10/2004 | Baumann et al. | ............... 331/74 |
| 6,909,417 B2 * | 6/2005 | Washio et al. | ................... 345/98 |
| 7,050,333 B2 * | 5/2006 | Matsue | .................... 365/185.28 |
| 7,178,737 B2 * | 2/2007 | Ohyama | ....................... 235/492 |

(Continued)

FOREIGN PATENT DOCUMENTS

| | | |
|---|---|---|
| EP | 0 738 984 | 3/1999 |
| JP | 08-316893 | 11/1996 |
| JP | 2004-282050 | 10/2004 |

OTHER PUBLICATIONS

International Search Report (Application No. PCT/JP2006/305755) dated Jun. 27, 2006.

(Continued)

*Primary Examiner* — Simon D Nguyen
(74) *Attorney, Agent, or Firm* — Eric J. Robinson; Robinson Intellectual Property Law Office, P.C.

(57) ABSTRACT

A semiconductor device having an antenna, an asynchronous counter, and a circuit is provided. The antenna converts a carrier wave into an electrical signal. The asynchronous counter has a plurality of flip-flop circuits, each of which has a plurality of thin film transistors. Alternatively, each of the plurality of flip-flop circuits has a plurality of transistors each including a channel portion formed of single crystal silicon. The circuit generates a power supply voltage using the electrical signal and supplies the generated power supply voltage to the asynchronous counter.

13 Claims, 15 Drawing Sheets

U.S. PATENT DOCUMENTS

| | | | |
|---|---|---|---|
| 7,218,641 B2* | 5/2007 | Kuffner et al. | 370/445 |
| 7,436,286 B2* | 10/2008 | Fischer et al. | 340/10.1 |
| 7,508,296 B2* | 3/2009 | Usami | 340/10.4 |
| 2003/0145216 A1* | 7/2003 | Nakane et al. | 713/193 |
| 2004/0164302 A1 | 8/2004 | Arai et al. | |

OTHER PUBLICATIONS

Written Opinion (Application No. PCT/JP2006/305755) dated Jun. 27, 2006.

* cited by examiner

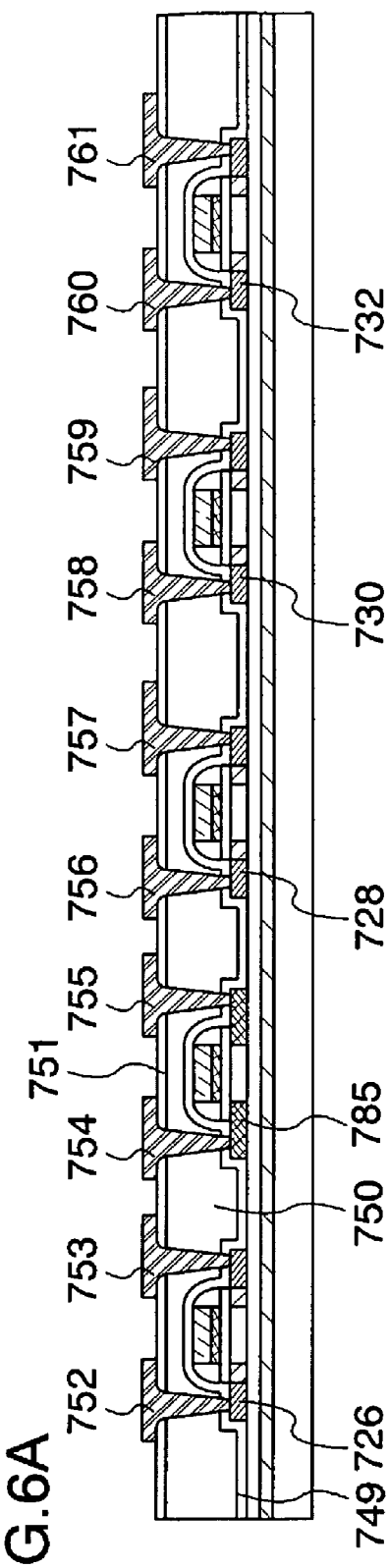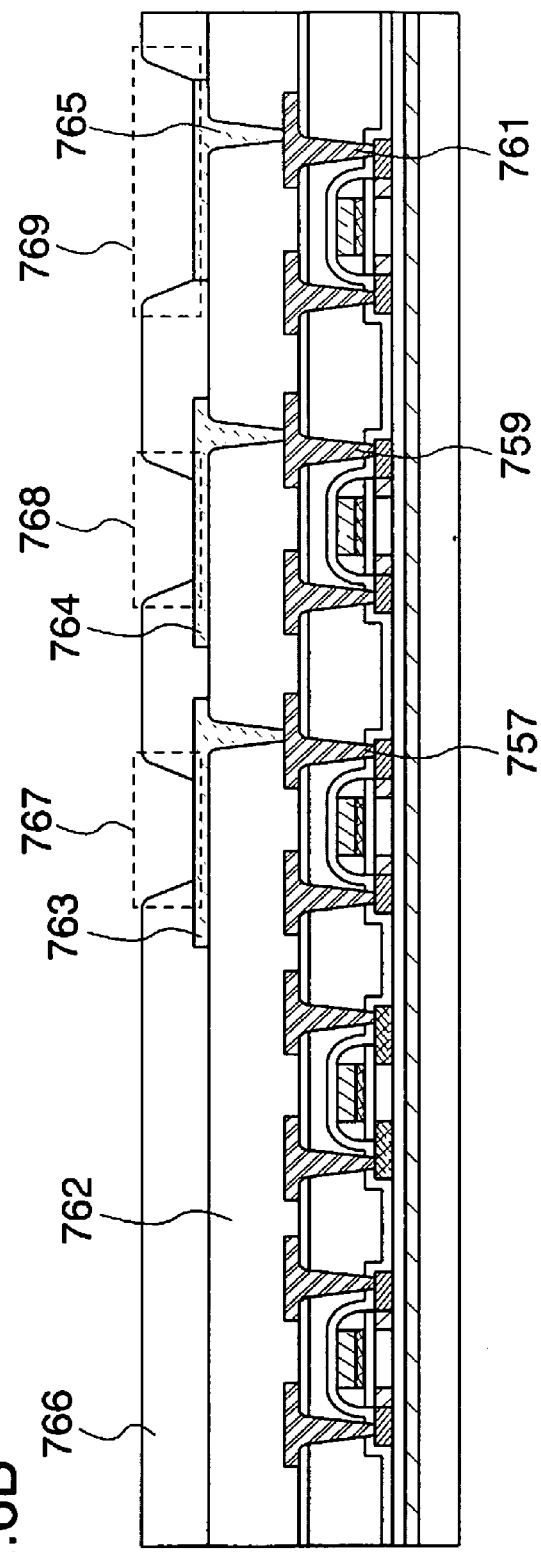

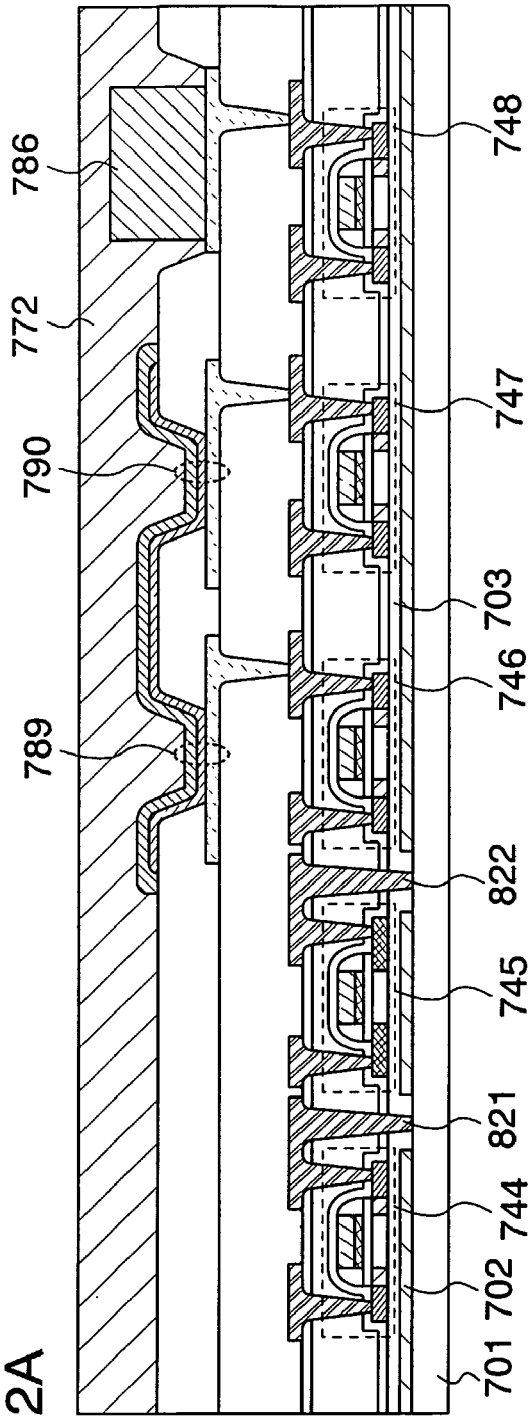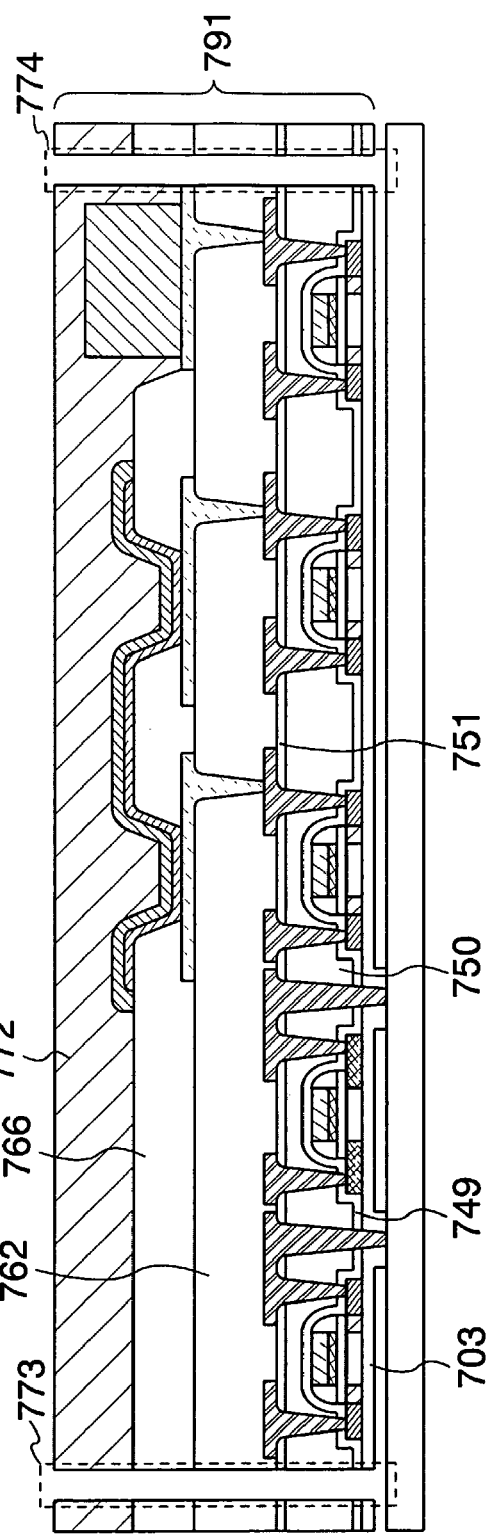

SEMICONDUCTOR DEVICE

TECHNICAL FIELD

The present invention relates to a semiconductor device capable of transmitting and receiving electromagnetic waves.

BACKGROUND ART

In recent years, a semiconductor device capable of transmitting and receiving electromagnetic waves has been developed. Such a semiconductor device is also called an RFID (Radio Frequency IDentification), an RF chip, an RF tag, an IC chip, an IC tag, an IC label, a wireless chip, a wireless tag, an electronic chip, an electronic tag, a wireless processor, a wireless memory, and the like (for example, see Patent Document 1).

[Patent Document 1] Japanese Patent Laid-Open No. 2004-282050 (pp. 11-14, FIG. 5)

DISCLOSURE OF INVENTION

A semiconductor device capable of transmitting and receiving electromagnetic waves has at least an antenna for converting a carrier wave into an AC electrical signal and a power supply circuit for generating a power supply voltage using the AC electrical signal converted by the antenna. Note that the carrier wave is also called a carrier and means an electromagnetic wave for transmitting a low-frequency signal such as an audio signal and a video signal.

Since a semiconductor device generates a power supply voltage using a carrier wave, a voltage drop may occur if instantaneous current consumption is high. Further, when the voltage drop occurs, an operation error may occur in each circuit of the semiconductor device.

In view of the foregoing, it is a primary object of the invention to prevent a voltage drop from occurring by reducing instantaneous current consumption. It is another object of the invention to prevent operation errors from occurring by preventing the voltage drop. It is still another object of the invention to provide a semiconductor device with a stabilized power supply by preventing the voltage drop.

A semiconductor device of the invention has an antenna that converts a carrier wave into an AC electrical signal, a power supply circuit (also called a circuit) that generates a power supply voltage using the electrical signal and supplies the generated power supply voltage to an asynchronous counter, and the asynchronous counter. The semiconductor device transmits and receives an electromagnetic wave using the antenna, and generates a power supply voltage using the antenna and the power supply circuit.

According to a first configuration of the semiconductor device of the invention, an asynchronous counter has a plurality of flip-flop circuits. Each of the plurality of flip-flop circuits has a plurality of thin film transistors that are provided over a substrate having an insulating surface. The asynchronous counter has operating characteristics of 1 to 100 MHz. The frequency of a carrier wave is 860 to 960 MHz, or 1 to 5 GHz. It is to be noted that the asynchronous counter with operating characteristics of 1 to 100 MHz means an asynchronous counter that can operate in accordance with a control signal with a frequency of 1 to 100 MHz. The substrate having an insulating surface corresponds to, for example, a substrate made of glass or plastic.

The aforementioned first configuration is characterized in that the asynchronous counter has a plurality of thin film transistors and has operating characteristics (also called operating performance) of 1 to 100 MHz. According to these characteristics, the period from the time when a signal is inputted to an input terminal of a flip-flop circuit at one end of the plurality of flip-flop circuits, to the time when a signal is outputted from an output terminal of a flip-flop circuit at the other end of the plurality of flip-flop circuits can be made longer than one cycle of a carrier wave. Accordingly, instantaneous current consumption can be reduced to achieve a stabilized power supply.

According to a second configuration of the semiconductor device of the invention, an asynchronous counter has a plurality of flip-flop circuits. Each of the plurality of flip-flop circuits has a plurality of transistors each including a channel portion formed of single crystal silicon. Each of the plurality of transistors has a channel length of 0.5 to 50 μm. The frequency of a carrier wave is 860 to 960 MHz or 1 to 5 GHz. The transistors each including a channel portion formed of single crystal silicon are transistors each using a single crystal silicon substrate in many cases.

According to the second configuration of the semiconductor device of the invention, which is different from the aforementioned one, an asynchronous counter has a plurality of flip-flop circuits. Each of the plurality of flip-flop circuits has a plurality of thin film transistors that are provided over a substrate having an insulating surface. Each of the thin film transistors has a channel length of 3 to 100 μm. The frequency of a carrier wave is 13.56 MHz.

According to the aforementioned second configuration, the driving capability of the transistors is lowered by setting the channel length of each transistor within the aforementioned range. Thus, the processing period (period from the time when a signal is inputted to an input terminal to the time when a signal is outputted from an output terminal) in one flip-flop circuit is increased. In addition, the period from the time when a signal is inputted to an input terminal of a flip-flop circuit at one end of the plurality of flip-flop circuits, to the time when a signal is outputted from an output terminal of a flip-flop circuit at the other end of the plurality of flip-flop circuits can be made longer than one cycle of a carrier wave. Accordingly, instantaneous current consumption can be reduced to achieve a stabilized power supply.

According to a third configuration of the semiconductor device of the invention, a delay circuit (also called a second circuit) is provided in addition to a power supply circuit (also called a first circuit) and an asynchronous counter. The asynchronous counter has m (m is a natural number) flip-flop circuits. The delay circuit has an element, a plurality of elements, a plurality of inverters, an element and a plurality of inverters, or a plurality of elements and a plurality of inverters. The element corresponds to a resistor or a capacitor. The plurality of elements corresponds to a resistor and a capacitor, a plurality of resistors, a plurality of capacitors, a resistor and a plurality of capacitors, a plurality of resistors and a capacitor, or a plurality of resistors and a plurality of capacitors. The delay circuit is connected to output terminals of n flip-flop circuits (n is a natural number, 1=n=m) selected from the m flip-flop circuits.

According to the aforementioned third configuration, the delay circuit is connected to the output terminals of the flip-flop circuits. Thus, the period from the time when a signal is inputted to an input terminal of a flip-flop circuit at one end of the plurality of flip-flop circuits to the time when a signal is outputted from the output terminal of a flip-flop circuit at the other end of the plurality of flip-flop circuits can be made longer than one cycle of a carrier wave. Accordingly, instantaneous current consumption can be reduced to achieve a stabilized power supply.

A semiconductor device of the invention has a demodulating circuit for demodulating the electrical signal converted by the antenna. The demodulating circuit has an asynchronous counter with any of the aforementioned configurations.

A semiconductor device of the invention has a demodulating circuit for demodulating the electrical signal converted by the antenna, and an instruction analyzing circuit for analyzing a signal that has been demodulated by the demodulating circuit. One or both of the demodulating circuit and the instruction analyzing circuit have an asynchronous counter with any of the aforementioned configurations.

A semiconductor device of the invention has a modulating circuit for modulating the load of the antenna. The modulating circuit has an asynchronous counter with any of the aforementioned configurations.

A semiconductor device of the invention has a memory circuit including a plurality of memory elements for storing data, and a control circuit for controlling writing and reading of data to and from the memory circuit. One or both of the memory circuit and the control circuit have an asynchronous counter with any of the aforementioned configurations.

A semiconductor device of the invention has a memory circuit including a plurality of memory circuits for storing data, a control circuit for controlling writing and reading of data to and from the memory circuit, a modulating circuit for modulating the load of the antenna, and a memory control circuit for supplying data stored in the memory circuit to the modulating circuit. One of more of the memory circuit, the control circuit, the modulating circuit, and the memory control circuit have an asynchronous counter with any of the aforementioned configurations.

A carrier wave is modulated every fixed period, and the fixed period is one cycle of a carrier wave. A transistor may include one channel forming region or a plurality of channel forming regions. If a transistor includes a plurality of channel forming regions, the channel length of the transistor is the total of the channel lengths of the plurality of channel forming regions.

According to the invention having the aforementioned configurations, instantaneous current consumption can be reduced, leading to the prevention of voltage drop and operation errors. In addition, reduction in instantaneous current consumption allows a power supply to be stabilized.

BRIEF DESCRIPTION OF DRAWINGS

FIGS. 6A and 6B are diagrams each showing a manufacturing step of the semiconductor device of the invention.

FIGS. 12A and 12B are diagrams each showing a manufacturing step of the semiconductor device of the invention.

BEST MODE FOR CARRYING OUT THE INVENTION

Figure 1:
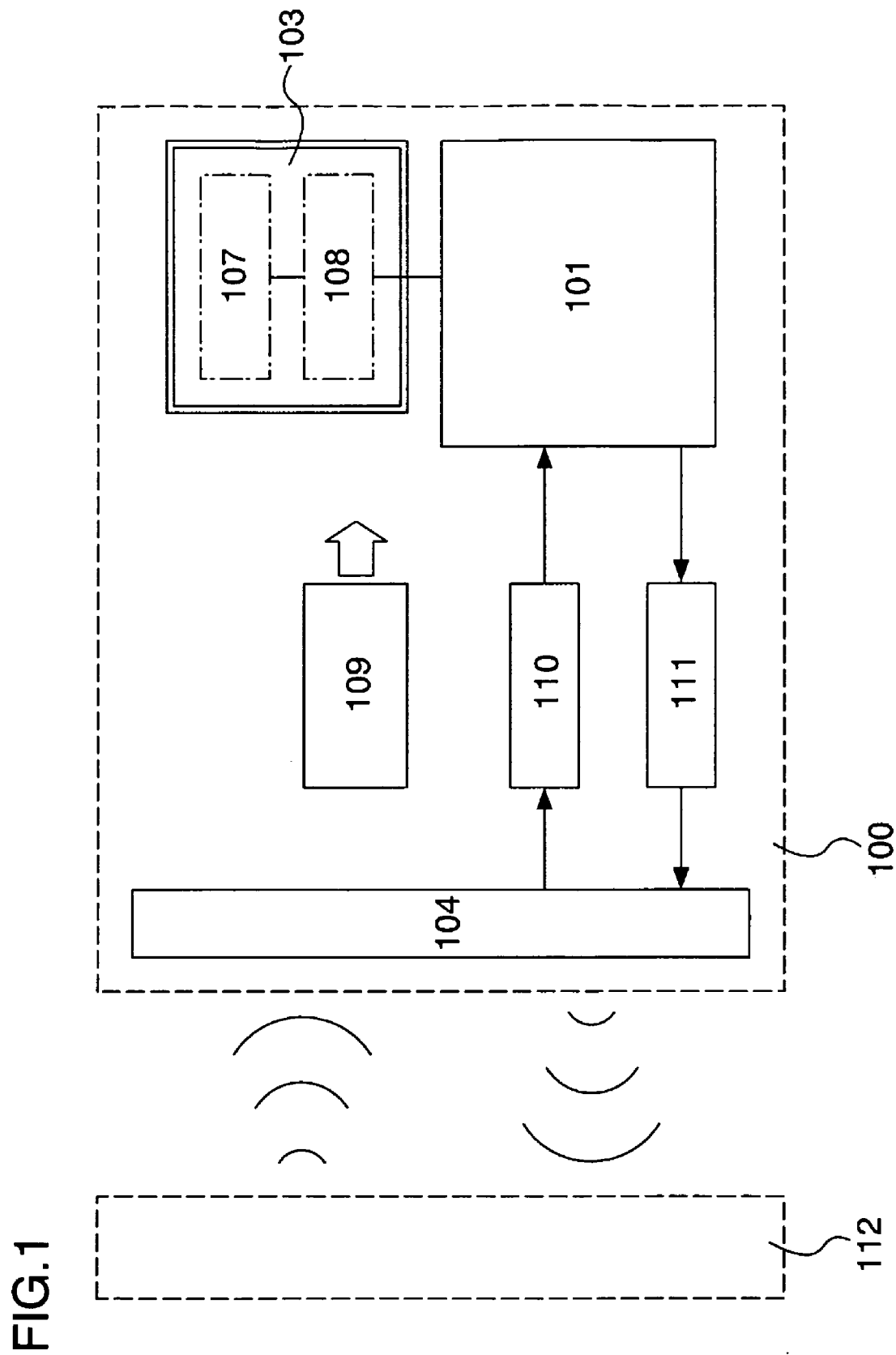
FIG. 1 is a diagram showing a configuration of the semiconductor device of the invention.

Although the invention will be described by way of embodiment mode and embodiments with reference to the accompanying drawings, it is to be understood that various changes and modifications will be apparent to those skilled in the art. Therefore, unless such changes and modifications depart from the scope of the invention, they should be construed as being included therein. Note that in the following description of the invention, the identical portions are denoted by the identical reference numerals in different drawings.

A configuration of a semiconductor device of the invention is described with reference to FIG. 1. A semiconductor device 100 of the invention has a circuit 101 including an instruction analyzing circuit and a memory control circuit, a memory circuit 103, an antenna 104, a power supply circuit 109, a demodulating circuit 110, and a modulating circuit 111. The semiconductor device 100 is required to have the antenna 104 and the power supply circuit 109, and the other elements are provided depending on the application of the semiconductor device 100.

In accordance with a signal inputted from the demodulating circuit 110, the circuit 101 including the instruction analyzing circuit and the memory control circuit analyzes instructions, controls the memory circuit 103, outputs data to be transmitted to the outside to the modulating circuit 111, and the like.

The memory circuit 103 has a circuit 107 including a memory element and a control circuit 108 for controlling writing and reading of data. The memory circuit 103 stores at least an identification number of the semiconductor device 100 itself. The identification number is used to identify the semiconductor device 100 from other semiconductor devices.

The memory circuit 103 has one or more of an organic memory, a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a three-layer stacked structure where a layer containing an organic compound is sandwiched between a pair of conductive layers. Since the organic memory has a simple structure, manufacturing steps can be simplified and cost reduction can be achieved. In addition, because of the simple structure it is easy to reduce the stacked area and lead to high integration. Further, the organic memory is advantageous in that it is a non-volatile memory and does not require a battery. Therefore, the organic memory is preferably used as the memory circuit 103.

The antenna 104 converts a carrier wave supplied from a reader/writer 112 into an AC electrical signal. The modulating circuit 111 modulates the load of the antenna 104.

The power supply circuit 109 generates a power supply voltage using an AC electrical signal converted by the antenna 104, and supplies the power supply voltage to each circuit.

The demodulating circuit 110 demodulates an AC electrical signal converted by the antenna 104, and supplies the demodulated signal to the circuit 101 including the instruction analyzing circuit and the memory control circuit.

The modulating circuit 111 modulates the load of the antenna 104 in accordance with a signal supplied from the circuit 101 including the instruction analyzing circuit and the memory control circuit.

The reader/writer 112 receives as a carrier wave the modulated load of the antenna 104. The reader/writer 112 also transmits the carrier wave to the semiconductor device 100.

It is to be noted that the carrier wave is an electromagnetic wave transmitted from the reader/writer 112. The frequency of the carrier wave is typically, depending on the communication standards, 13.56 MHz, 860 to 960 MHz, or 2.45 GHz.

Each of the circuit 101 including the instruction analyzing circuit and the memory control circuit, the memory circuit 103, the power supply circuit 109, the demodulating circuit 110, and the modulating circuit 111 has a counter (also called a counter circuit) depending on its configuration. The counter is a circuit that is used as a divider circuit of a clock signal or used for generating various control signals by counting a fixed number.

The counter is classified into a synchronous counter and an asynchronous counter. The synchronous counter has a configuration for counting in synchronism with a clock signal. The asynchronous counter is not synchronized with a clock signal and has a configuration where a flip-flop circuit operates in accordance with the output of a flip-flop circuit of the preceding stage.

The invention is characterized by using an asynchronous counter as the counter. More specifically, the invention is characterized by using an asynchronous counter for which the time required for one count is longer than one cycle of a carrier wave. By actively using an asynchronous counter that does not operate in synchronism with a clock signal, instantaneous current consumption can be reduced, and the voltage drop and operation errors can be suppressed. In addition, reduction in instantaneous current consumption allows a power supply to be stabilized.

A configuration of an asynchronous counter is described below with reference to FIGS. 2A to 2D and FIG. 3.

Figure 2A:
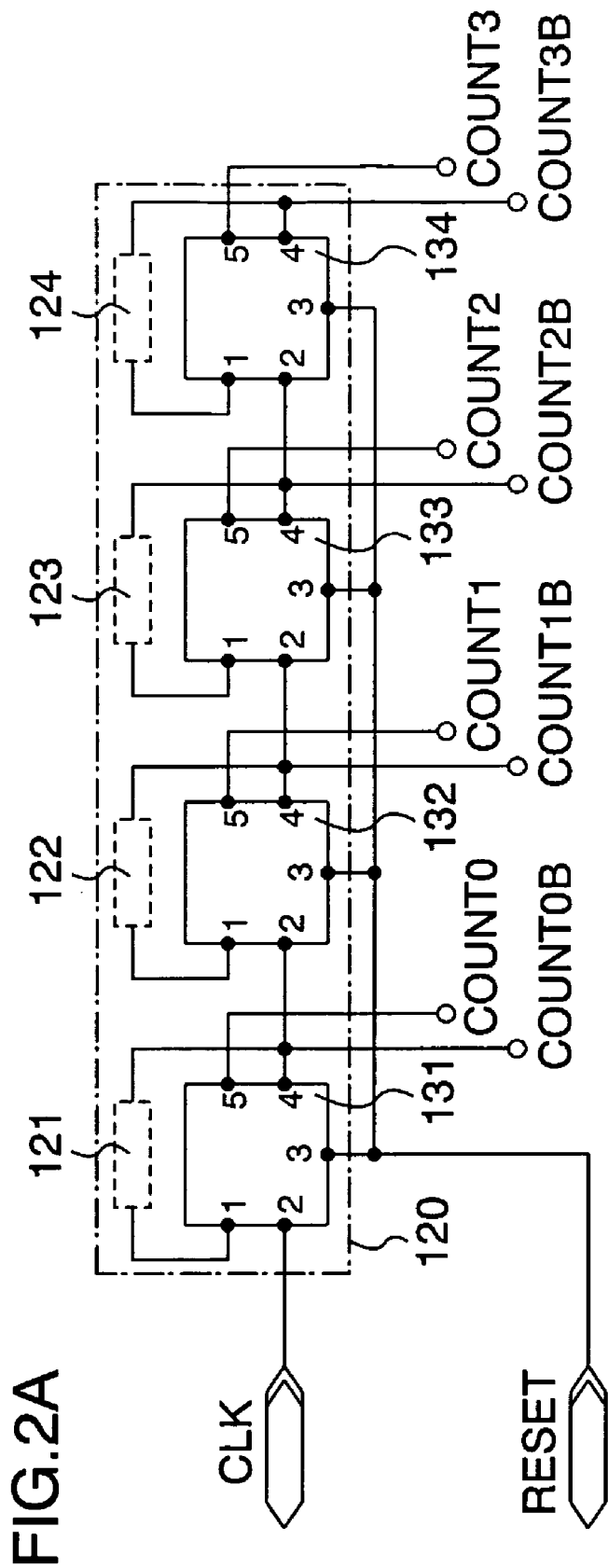
FIG. 2A to 2D are diagrams each showing a configuration of the semiconductor device of the invention.
Figure 2D:
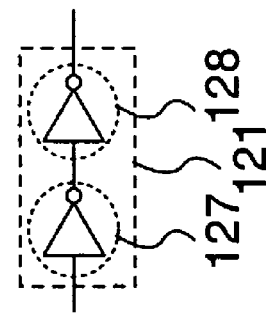
Figure 2C:
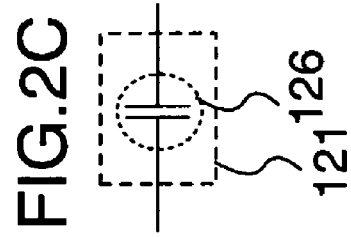
Figure 2B:
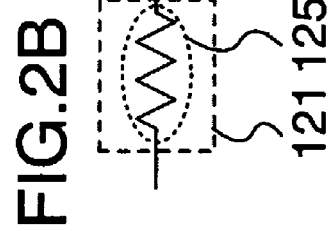
Figure 3:
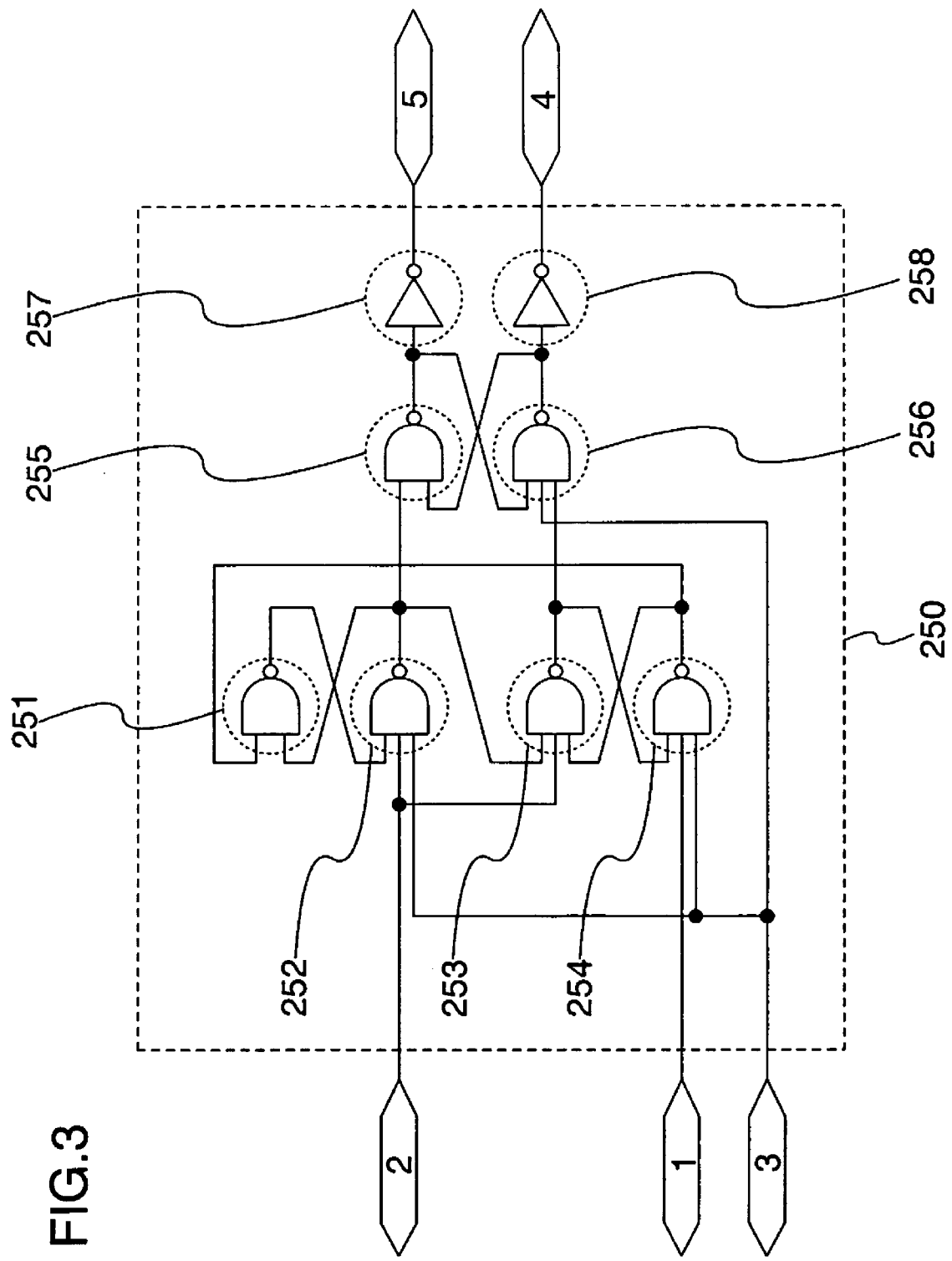
FIG. 3 is a diagram showing a configuration of the semiconductor device of the invention.

An asynchronous counter 120 has a plurality of flip-flop circuits 131 to 134 that are connected in series to each other (see FIG. 2A). Each of the plurality of flip-flop circuits 131 to 134 has NAND circuits 251 to 256 and inverter circuits 257 and 258 (see FIG. 3). Each of the plurality of flip-flop circuits 131 to 134 has at least two input terminals (FIG. 3 shows three input terminals 1 to 3) and two output terminals (FIG. 3 shows two output terminals 4 and 5). Each of the plurality of flip-flop circuits 131 to 134 is a delay flip-flop (D-FF) where a data signal is inputted to the input terminal 1, a clock signal is inputted to the input terminal 2, a set signal is inputted to the input terminal 3, an output XQ is outputted from the output terminal 4, and an output Q is outputted from the output terminal 5. Note that the input terminal 3 is not necessarily provided, and an input terminal to which a preset signal is inputted may be additionally provided.

One of the plurality of flip-flop circuits 131 to 134 included in the asynchronous counter 120 may be called one stage. For example, the asynchronous counter 120 shown in FIG. 2, which has the four flip-flop circuits, may be called a four-stage asynchronous counter.

Among the plurality of flip-flop circuits 131 to 134 included in the asynchronous counter 120, the first stage flip-flop circuit to which a clock signal is inputted may be called a flip-flop circuit at one end, while the last stage flip-flop circuit may be called a flip-flop circuit at another end. For example in the asynchronous counter 120, the flip-flop circuit 131 is a flip-flop circuit at one end, while the flip-flop circuit 134 is a flip-flop circuit at the other end.

The period of one count of the asynchronous counter 120 corresponds to a period from the time when a signal is inputted to an input terminal of a flip-flop circuit at one end of a plurality of flip-flop circuits to the time when a signal is outputted from an output terminal of a flip-flop circuit at the other end. For example in the asynchronous counter 120 shown in FIG. 2, the period of one count corresponds to a period from the time when a signal is inputted to an input terminal of the flip-flop circuit 131 to the time when a signal is outputted from an output terminal of the flip-flop circuit 134.

The flip-flop circuits included in the asynchronous counter 120 may have other known circuit configurations such as a configuration using a JK flip-flop (JK-FF), a toggle flip-flop (T-FF), a reset/set flip-flop (RF-FF), or a reset/set toggle flip-flop (RST-FF) as well as a configuration using a delay flip-flop. The number of stages of the asynchronous counter 120 is not particularly limited, and may be determined depending on the function or purpose of the circuit.

The period of one count of the asynchronous counter 120 used in the invention is longer than one cycle of a carrier wave. The asynchronous counter 120 has any of the following three configurations: a first configuration is characterized by using a thin film transistor provided over a substrate having an insulating surface; a second configuration is characterized in terms of the size of a transistor; and a third configuration is characterized in terms of the circuit configuration.

The first configuration is characterized by using a thin film transistor, specifically, by actively using the characteristics of a thin film transistor provided over a substrate having an insulating surface.

An asynchronous counter using a thin film transistor that is formed over a substrate having an insulating surface typically operates at a frequency of 1 to 100 MHz, and the time of one stage of the asynchronous counter is typically 1 to 100 nsec. If an asynchronous counter has about 10 stages in that case, the period of one count thereof is 10 to 1000 nsec. On the other hand, if using a carrier wave with a frequency of 860 to 960 MHz, one cycle of the carrier wave is about 1 nsec.

Accordingly, by using a thin film transistor, the period of one count can be made longer than one cycle of a carrier wave. As a result, instantaneous current consumption can be reduced to achieve a stabilized power supply, the voltage drop can be suppressed, and operation errors can be prevented. This effect is advantageous when using a carrier wave with a frequency of 860 to 960 MHz or 1 GHz or more.

A transistor having a channel portion formed of single crystal silicon is described for comparison. An asynchronous counter using a transistor that has a channel portion formed of single crystal silicon typically operates at a frequency of 1 GHz or more, and the delay time of one stage thereof is typically 0.01 to 0.1 nsec. If an asynchronous counter has about 10 stages in that case, the period of one count thereof is 0.1 to 1 nsec. On the other hand, if using a carrier wave with a frequency of 860 to 960 MHz, one cycle of the carrier wave is about 1 nsec. Accordingly, the period of one count of the asynchronous counter with about 10 stages is shorter than one cycle of the carrier wave.

The second configuration is characterized in terms of the size of a transistor. The period of one count of an asynchronous counter can be controlled by optimizing the size of a transistor constituting the asynchronous counter. In general, the longer the channel length of a transistor is, the lower the driving capability of the transistor is, and the smaller the channel width of a transistor is, the lower the driving capability of the transistor is.

For example, if an asynchronous counter, which uses a transistor having a channel portion formed of single crystal silicon and having a channel length of 0.1 µm, operates at a frequency of a few GHz, the delay time of one stage of the asynchronous counter is typically 0.01 to 0.1 nsec. If an asynchronous counter has about 10 stages in that case, the period of one count thereof is 0.1 to 1 nsec. On the other hand, if using a carrier wave with a frequency of 860 to 960 MHz, one cycle of the carrier wave is about 1 nsec. Accordingly, the period of one count of the asynchronous counter with about 10 stages is shorter than one cycle of the carrier wave.

Thus, according to the second configuration of the invention, a transistor having a channel portion formed of single crystal silicon is designed to have a long channel length, which results in lowering the driving capability of the transistor. As a result, the delay time of one stage of an asynchronous counter is increased and the period of one count of the asynchronous counter is made longer than one cycle of a carrier wave.

For example, when a transistor having a channel portion formed of single crystal silicon is designed to have a channel length of 0.5 to 50 µm, the period of one count of an asynchronous counter with about 10 stages can be made longer than one cycle of a carrier wave. This structure is advantageous particularly when using a carrier wave with a frequency of 860 to 960 MHz or 1 GHz or more.

As another example, if an asynchronous counter, which uses a thin film transistor that is formed over a substrate having an insulating surface and has a channel length of 0.5 µm, operates at a frequency of 10 to 100 MHz, the delay time of one stage of the asynchronous counter is typically 0.1 to 1 nsec. If an asynchronous counter has about 10 stages in that case, the period of one count thereof is 1 to 10 nsec. On the other hand, if using a carrier wave with a frequency of 13.56 MHz, one cycle of the carrier wave is about 75 nsec. Accordingly, the period of one count of the asynchronous counter with about 10 stages is shorter than one cycle of the carrier wave.

Thus, according to the second configuration of the invention, a thin film transistor is designed to have a long channel length, which results in lowering the driving capability of the thin film transistor. As a result, the delay time of one stage of an asynchronous counter is increased and the period of one count of the asynchronous counter is made longer than one cycle of a carrier wave. In order that the period of one count of an asynchronous counter with about 10 stages is made longer than one cycle of a carrier wave, the channel length of a thin film transistor is typically 3 to 100 µM, although depending on the characteristics of the thin film transistor. This structure is advantageous particularly when using a carrier wave with a frequency of 13.56 MHz.

More specifically, in an ordinary semiconductor device, the channel length of a transistor used for an asynchronous counter is equal to that of a transistor used for a peripheral logic circuit. According to the invention, a transistor used for an asynchronous counter is designed to have a longer channel length. As a result, the delay time of one stage of an asynchronous counter is increased and the period of one count of the asynchronous counter is made longer than one cycle of a carrier wave. Thus, current consumption during one cycle of the carrier wave is reduced.

For example, an asynchronous counter included in one or more of the circuits 101, 103, 109, 110, and 111 is referred to as a first circuit, while circuits other than the asynchronous counter, which constitute the circuits 101, 103, 109, 110, and 111, are referred to as a second circuit. The second circuit has a flip-flop circuit similarly to the first circuit. The second circuit corresponds to, for example, a static register or a shift register. According to the aforementioned second configuration, the channel length L1 of a transistor constituting the flip-flop circuit included in the first circuit is longer than the channel length L2 of a transistor constituting the flip-flop circuit included in the second circuit.

The third configuration is characterized in terms of circuit configuration. The third configuration is characterized in that a delay circuit is connected to an output terminal of a logic circuit that constitutes an asynchronous counter. More specifically, the third configuration is characterized in that delay circuits 121 to 124 are provided in addition to the plurality of flip-flop circuits 131 to 134 (see FIG. 2A). The delay circuits 121 to 124 correspond to an element, a plurality of elements, a plurality of inverters, an element and a plurality of inverters, or a plurality of elements and a plurality of inverters. The element corresponds to a resistor 125 or a capacitor 126 (see FIGS. 2B and 2C). The plurality of elements corresponds to a resistor 125 and a capacitor 126, a plurality of resistors, a plurality of capacitors, a resistor 125 and a plurality of capacitors, a plurality of resistors and a capacitor 126, or a plurality of resistors and a plurality of capacitors. The plurality of inverters corresponds to a plurality of (an even number of) inverter circuits 127 and 128 that are connected in series to each other (see FIGS. 2B to 2D). The delay circuits are connected to one or more output terminals of the plurality of flip-flop circuits.

If a capacitor is used as the delay circuit, the parasitic capacitance of an input terminal of the next stage flip-flop circuit may be used. In other words, the channel width of a transistor constituting the next stage logic circuit may be increased to use the gate capacitance of the transistor. The delay time using the delay circuits 121 to 124 may be determined depending on a carrier wave to be received.

Although the first configuration, the second configuration, and the third configuration are described separately in this embodiment mode, the invention may have a plurality of configurations selected from the first configuration, the second configuration, and the third configuration. That is to say, the invention may have a plurality of mixed configurations. The period of one count of an asynchronous counter may be made longer than one cycle of a carrier wave by combining the plurality of configurations.

Embodiment 1

Figure 4A:
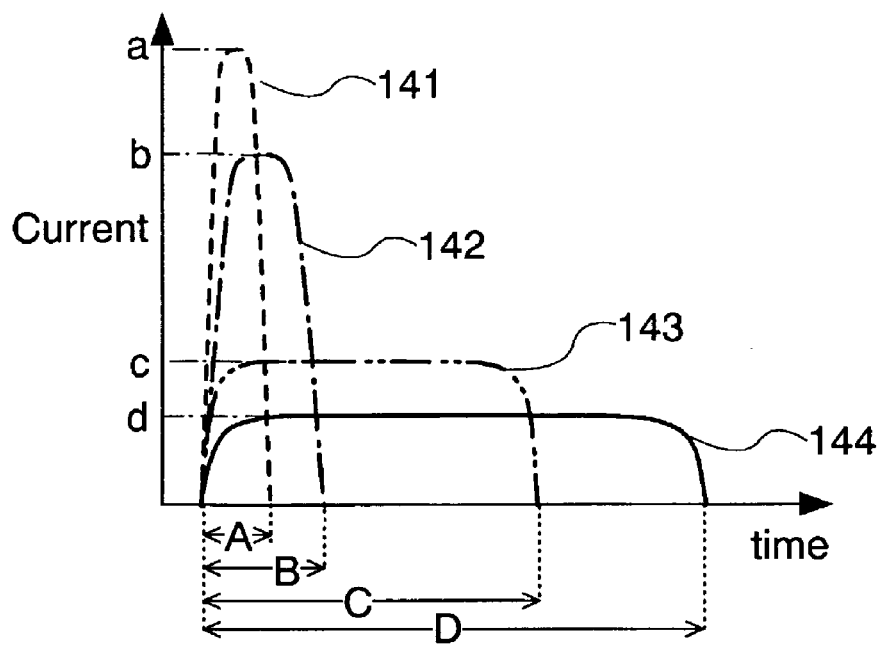
FIGS. 4A to 4C are diagrams each showing a configuration of the semiconductor device of the invention.

Advantageous effects produced by the asynchronous counter 120 of the invention are described with reference to a graph showing a relation between time and current (see FIG. 4A). The graph shows a waveform when the asynchronous counter 120 changes from "1111" to "0000". For comparison, the graph shows a waveform of a synchronous counter and a waveform of an asynchronous counter that is different from the one of the invention. Each of the synchronous counter and the asynchronous counters is a 4-digit binary counter.

The asynchronous counter different from the one of the invention means an asynchronous counter that has none of the aforementioned first configuration, the second configuration, and the third configuration. Specifically, the asynchronous counter different from the one of the invention corresponds to any one of the following four cases: an asynchronous counter has a thin film transistor and does not operate at a frequency of 1 to 100 MHz; an asynchronous counter has a transistor that includes a channel portion formed of single crystal silicon and that does not have a channel length of 0.5 to 50 μm; an asynchronous counter has a thin film transistor that does not have a channel length of 3 to 100 μm; and an asynchronous counter does not have a delay circuit.

A waveform 141 is a waveform of the synchronous counter, and a waveform 142 is a waveform of the asynchronous counter different from the one of the invention. A waveform 143 and a waveform 144 are waveforms of the asynchronous counter 120 having the aforementioned first configuration, the second configuration, or the third configuration. The waveform 141, the waveform 142, and the waveform 143 have different delay times of one stage.

The waveform 141 shows that the synchronous counter requires a time A for one operation. The waveform 141 also shows that up to a current a flows through the synchronous counter for one operation. The waveform 142 shows that the asynchronous counter requires a time B for one operation and up to a current b flows therethrough for one operation. The waveform 143 shows that the asynchronous counter 120 requires a time C for one operation and up to a current c flows therethrough for one operation. The waveform 144 shows that the asynchronous counter 120 requires a time-D for one operation and up to a current d flows therethrough for one operation.

The time A, the time B, the time C, and the time D satisfy $A<B<C<D$, and the current a, the current b, the current c, and the current d satisfy $a>b>c>d$. This graph shows that according to the invention using the asynchronous counter, the period of one count can be controlled and instantaneous current consumption can be reduced. This effect is advantageous particularly for a semiconductor device that generates a power supply voltage in accordance with an electromagnetic wave transmitted from a reader/writer. This is because in a semiconductor device generating a power supply voltage in accordance with an electromagnetic wave, a voltage drop and an operation error may occur when a large amount of current is consumed during one cycle of a carrier wave.

It is to be noted that the aforementioned effect is brought about only when a time for one operation is longer than one cycle of a carrier wave. As an example, the voltage drop that occurs when one cycle of a carrier wave is a time E is described below with reference to FIGS. 4B and 4C.

Figure 4B:
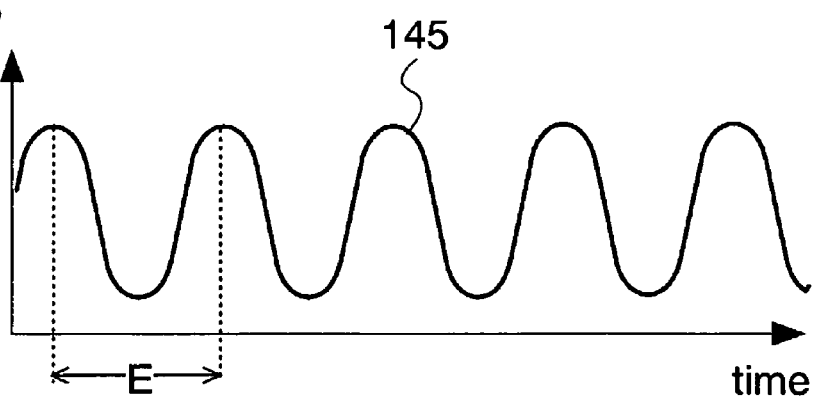
Figure 4C:
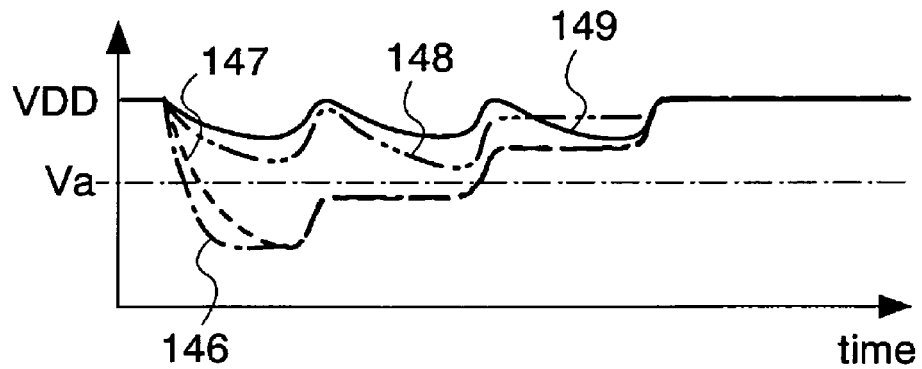

In FIG. 4B, a waveform 145 is a waveform of a carrier wave. In FIG. 4C, waveforms 146 to 149 show voltage values that are reduced from a power supply voltage (VDD) due to the voltage drop. A voltage value required for normal operation is Va or more.

The waveform 148 and the waveform 149 are waveforms of the voltage drop that occurs in the asynchronous counter 120 having the aforementioned first configuration, the second configuration, or the third configuration. The waveform 146 is a waveform of the voltage drop that occurs in the synchronous counter, and the waveform 147 is a waveform of the voltage drop that occurs in the asynchronous counter that has none of the first configuration, the second configuration, and the third configuration of the invention. The time A, the time B, the time C, and the time D satisfy $A<B<E<C<D$, FIG. 4C shows that the voltage value of the asynchronous counter 120 used in the invention does not drop to Va or less. This is because the period of one count is set longer than one cycle of a carrier wave by controlling the delay time of one stage of the asynchronous counter 120, and current consumption during one cycle of a carrier wave can be reduced.

On the other hand, FIG. 4C shows that the voltage value of each of the waveform 146 and the waveform 147 drops to Va or less. This is because the period of one count of the synchronous counter and the asynchronous counter is shorter than one cycle of a carrier wave, and current consumption during one cycle of a carrier wave is high.

Embodiment 2

A manufacturing method of a semiconductor device of the invention is described with reference to drawings. More specifically, a manufacturing method of a semiconductor device having a thin film transistor, a memory element, and a conductive layer functioning as an antenna are described with reference to drawings. The thin film transistor is an element that constitutes each circuit of a semiconductor device, such as an asynchronous counter and a power supply circuit.

Figure 5A:
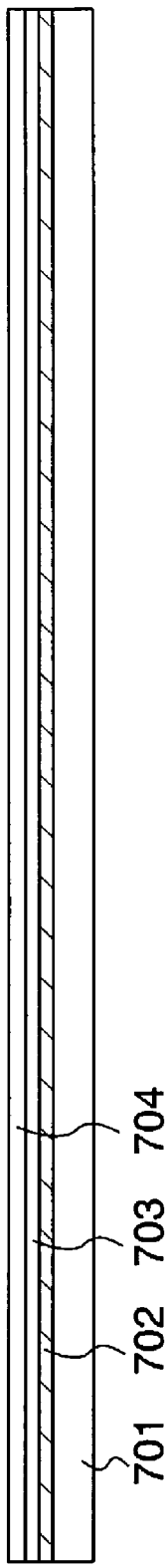
FIGS. 5A to 5C are diagrams each showing a manufacturing step of the semiconductor device of the invention.

A separation layer 702 is formed over a surface of a substrate 701 (also called a base) (see FIG. 5A). The substrate 701 has an insulating surface. If the substrate 701 is formed of glass, it is not particularly limited in area and shape. Accordingly, when, for example, a rectangular substrate with a side of one meter or more is used as the substrate 701, the productivity can be significantly improved. This is a major advantage as compared to the case of using a circular single crystal silicon substrate. If the substrate 701 is formed of plastic, it is necessary to use heat resistant plastic that is resistant to processing temperatures in the manufacturing steps. It is preferable to form a thin film transistor over the substrate 701 formed of glass, separate the thin film transistor, and provide the separated thin film transistor over a plastic substrate.

Although the separation layer 702 is formed over the entire surface of the substrate 701 in the aforementioned step, the separation layer 702 formed over the entire surface of the substrate 701 may be patterned by photolithography to be selectively provided, if necessary. Further, although the separation layer 702 is formed in contact with the substrate 701, an insulating layer may be formed as a base in contact with the substrate 701 as needed, and the separation layer 702 may be formed in contact with the insulating layer.

In order to obtain the separation layer 702, a single layer or stacked layers are formed by a known method (sputtering, plasma CVD, or the like) using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material mainly containing such elements. If the separation layer 702 is formed of a layer containing silicon, the layer containing silicon may have any of an amorphous structure, a microcrystalline structure, and a polycrystalline structure.

An insulating layer 703 is formed as a base covering the separation layer 702. In order to obtain the insulating layer 703, a single layer or stacked layers are formed by a known method (sputtering, plasma CVD, or the like) using an oxide of silicon or a nitride of silicon. The oxide material of silicon is a substance containing silicon (Si) and oxygen (O), which corresponds to silicon oxide, silicon oxide containing nitrogen, and the like. The nitride material of silicon is a substance containing silicon and nitrogen (N), which corresponds to silicon nitride, silicon nitride containing oxygen, and the like. The insulating layer 703 that is a base functions as a blocking film to prevent impurities from entering from the substrate 701.

Figure 5B:
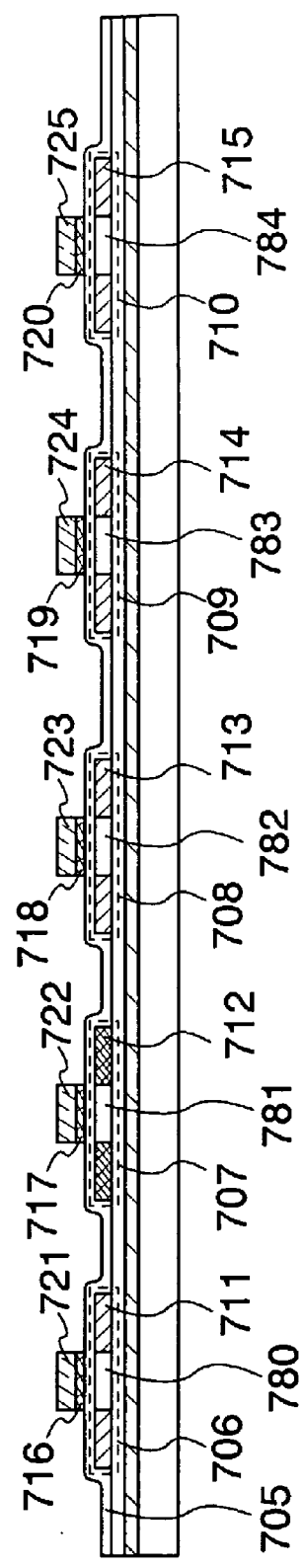

An amorphous semiconductor layer 704 is formed over the insulating layer 703. The amorphous semiconductor layer 704 is formed by a known method (sputtering, LPCVD, plasma CVD, or the like). Subsequently, the amorphous semiconductor layer 704 is crystallized by a known crystallizing method (laser crystallization, thermal crystallization using RTA or an annealing furnace, thermal crystallization using a metal element that accelerates crystallization, laser crystallization combined with thermal crystallization using a metal element that accelerates crystallization, or the like), thereby forming a crystalline semiconductor layer. Then, the obtained crystalline semiconductor layer is patterned into a desired shape, thereby forming crystalline semiconductor layers 706 to 710 (see FIG. 5B).

An example of manufacturing steps of the crystalline semiconductor layers 706 to 710 is described below. First, an amorphous semiconductor layer is formed by plasma CVD. After a solution containing nickel that is a metal element for accelerating crystallization is retained on the surface of the amorphous semiconductor layer, the amorphous semiconductor layer is subjected to dehydrogenation treatment (500° C., one hour) and thermal crystallization (550° C., four hours), thereby forming a crystalline semiconductor layer. Then, the crystalline semiconductor layer is irradiated with laser light as needed, and patterned by photolithography to form the crystalline semiconductor layers 706 to 710. If the crystalline semiconductor layers 706 to 710 are formed by laser crystallization, a gas laser or a solid-state laser is used. The gas laser and the solid-state laser may be either a continuous wave laser or a pulsed laser.

When the amorphous semiconductor layer is crystallized using a metal element that accelerates crystallization, crystallization can be performed at a low temperature in a short time and crystals can be aligned in the same direction. On the other hand, off-current increases since the metal element remains in the crystalline semiconductor layers, leading to variations in characteristics. Accordingly, an amorphous semiconductor layer functioning as a gettering site is preferably formed over the crystalline semiconductor layers. The amorphous semiconductor layer functioning as a gettering site is required to contain an impurity element such as phosphorus and argon; therefore, it is preferably formed by sputtering so as to contain argon at a high concentration. Then, a metal element is diffused in the amorphous semiconductor layer by heat treatment (such as thermal annealing using RTA or an annealing furnace), and the amorphous semiconductor layer containing the metal element is removed. As a result, the metal element in the crystalline semiconductor layers can be reduced or removed.

Subsequently, a gate insulating layer 705 is formed to cover the crystalline semiconductor layers 706 to 710. In order to obtain the gate insulating layer 705, a single layer or stacked layers are formed by a known method (plasma CVD, sputtering, or the like) using an oxide of silicon or a nitride of silicon.

A first conductive layer and a second conductive layer are stacked over the gate insulating layer 705. The first conductive layer is formed by a known method (plasma CVD, sputtering, or the like) to have a thickness of 20 to 100 nm. The second conductive layer is formed by a known method to have a thickness of 100 to 400 nm.

The first conductive layer and the second conductive layer are formed of an element selected from tantalum (Ta), tungsten (W), titanium (Ti), molybdenum (Mo), aluminum (Al), copper (Cu), and chromium (Cr), or an alloy material or a compound material that mainly contains these elements. Alternatively, the first conductive layer and the second conductive layer are formed of a semiconductor material typified by polycrystalline silicon doped with an impurity element such as phosphorus.

The first conductive layer and the second conductive layer may be formed of, for example, a tantalum nitride layer and a tungsten layer, a tungsten nitride layer and a tungsten layer, a molybdenum nitride layer and a molybdenum layer, or the like. If the first conductive layer and the second conductive layer are formed of tungsten or tantalum nitride that has high heat resistance, they may be subjected to heat treatment for thermal activation. If a three-layer structure is adopted instead of the two-layer structure, a molybdenum layer, an aluminum layer and a molybdenum layer may be stacked.

A resist mask is formed by photolithography, and conductive layers 716 to 725 functioning as gate electrodes are formed by etching for forming gate electrodes and gate wires.

A resist mask is formed by photolithography, and a low concentration of an impurity element that imparts N-type conductivity is added to the crystalline semiconductor layers 706 and 708 to 710 by ion doping or ion implantation, thereby forming impurity regions 711 and 713 to 715 and channel forming regions 780 and 782 to 784. The impurity element that imparts N-type conductivity may be an element belonging to group 15 of the periodic table, and for example, phosphorus (P) or arsenic (As) may be used.

A resist mask is formed by photolithography, and an impurity element that imparts P-type conductivity is added to the crystalline semiconductor layer 707, thereby forming an impurity region 712 and a channel forming region 781. As the impurity element that imparts P-type conductivity, for example, boron (B) is used.

Figure 5C:
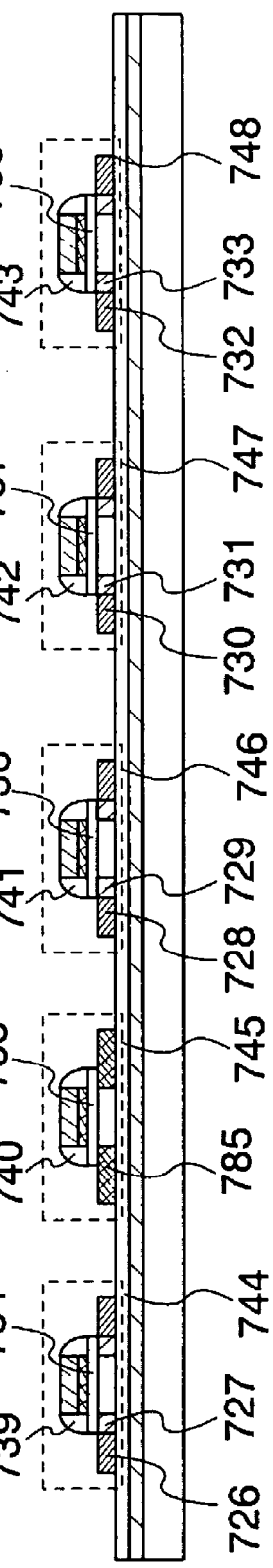

An insulating layer is formed to cover the gate insulating layer 705 and the conductive layers 716 to 725. In order to obtain the insulating layer, a single layer or stacked layers are formed by a known method (plasma CVD, sputtering, or the like) using a layer containing an inorganic material such as silicon, an oxide of silicon, and a nitride of silicon, or a layer containing an organic material such as an organic resin. Then, the insulating layer is selectively etched by anisotropic etching that is mainly in the direction perpendicular to the surface of the substrate, so that insulating layers (also called sidewalls) 739 to 743 are formed in contact with the sides of the conductive layers 716 to 725 (see FIG. 5C). While forming the insulating layers 739 to 743, insulating layers 734 to 738 are formed by etching the insulating layer 705. The insulating layers 739 to 743 are used as masks in a subsequent doping step for forming LDD (Lightly Doped Drain) regions.

A resist mask is formed by photolithography. Then, an impurity element that imparts N-type conductivity is added to the crystalline semiconductor layers 706 and 708 to 710 using as masks the resist mask and the insulating layers 739 to 743, thereby forming first impurity regions (also called LDD regions) 727, 729, 731, and 733 and second impurity regions 726, 728, 730, and 732. The concentration of the impurity element in the first impurity regions 727, 729, 731, and 733 is lower than that in the second impurity regions 726, 728, 730, and 732. Through the aforementioned steps, N-channel thin film transistors 744 and 746 to 748 and a P-channel thin film transistor 745 are completed.

Subsequently, an insulating layer is formed of a single layer or stacked layers so as to cover the thin film transistors 744 to 748 (see FIG. 6A). In order to obtain the insulating layer covering the thin film transistors 744 to 748, a single layer or stacked layers are formed by a known method (SOG, droplet discharging, or the like) using an inorganic material such as an oxide of silicon and a nitride of silicon, an organic material such as polyimide, polyamide, benzocyclobutene, acrylic, epoxy, and siloxane, or the like. Siloxane corresponds to a resin including Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be used as the substituent. Further alternatively, a fluoro group and an organic group containing at least hydrogen may be used as the substituent.

If the insulating layer covering the thin film transistors 744 to 748 has, for example, a three-layer structure, a layer containing silicon oxide may be formed as a first insulating layer 749, a layer containing a resin may be formed as a second insulating layer 750, and a layer containing silicon nitride may be formed as a third insulating layer 751.

Before forming the insulating layers 749 to 751 or after forming one or more of the insulating layers 749 to 751, heat treatment may be performed for recovery of the crystallinity of the semiconductor layers, activation of the impurity elements added to the semiconductor layers, and hydrogenation of the semiconductor layers. As the heat treatment, thermal annealing, laser annealing, RTA or the like may be adopted.

Next, the insulating layers 749 to 751 are etched by photolithography, thereby forming openings to expose the second impurity regions 726, 728, 730, and 732 and the impurity region 785. Then, conductive layers are formed to fill in the openings, and patterned to form conductive layers 752 to 761 functioning as source wires or drain wires.

In order to obtain the conductive layers 752 to 761, a single layer or stacked layers are formed by a known method (plasma CVD, sputtering, or the like) using an element selected from titanium (Ti), aluminum (Al), and neodymium (Nd), or an alloy material or a compound material mainly containing such elements. The alloy material mainly containing aluminum corresponds to, for example, a material that mainly contains aluminum and contains nickel, a material that mainly contains aluminum and contains silicon, or a material that mainly contains aluminum and contains one or more of nickel, carbon, and silicon. The conductive layers 752 to 761 may adopt, for example, a stacked layer structure of a barrier layer, an aluminum layer containing silicon, and a barrier layer, or a stacked layer structure of a barrier layer, an aluminum layer containing silicon, a titanium nitride layer, and a barrier layer. Here, an aluminum layer containing silicon contains 0.1 to 5 wt % of silicon. In addition, the barrier layer corresponds to a thin film made of titanium, a nitride of titanium, molybdenum, or a nitride or molybdenum. Aluminum and aluminum containing silicon are optimal for the material of the conductive layers 752 to 761 since they have a low resistance value and are inexpensive. If barrier layers are provided as the top and bottom layers, hillock generation of aluminum or aluminum containing silicon can be prevented. Further, if the barrier layer is formed of titanium that has high reducing ability, a thin natural oxide film which may possibly be formed over the crystalline semiconductor layers can be reduced, and disconnection between the barrier layer and the crystalline semiconductor layers can be prevented.

Subsequently, an insulating layer 762 is formed to cover the conductive layers 752 to 761 (see FIG. 6B). In order to obtain the insulating layer 762, a single layer or stacked layers are formed by a known method (SOG, droplet discharging, or the like) using an inorganic material or an organic material. The insulating layer 762 is preferably formed to have a thickness of 0.75 to 3 μm.

The insulating layer 762 is etched by photolithography, thereby forming openings to expose the conductive layers 757, 759, and 761. Then, a conductive layer is formed to fill in the openings. The conductive layer is formed by a known method (plasma CVD, sputtering, or the like) using a conductive material. Subsequently, the conductive layer is patterned to form conductive layers 763 to 765.

Each of the conductive layers 763 to 765 corresponds to one of a pair of conductive layers included in a memory element. Accordingly, it is preferable that each of the conductive layers 763 to 765 be formed of a single layer or stacked layers using titanium, or an alloy material or a compound material that mainly contains titanium. Since titanium has a low resistance value, the size of the memory element can be reduced, leading to high integration. In addition, in a photolithography step for forming the conductive layers 763 to 765, wet etching is preferably performed in order not to damage the thin film transistors 744 to 748 on the bottom layer, and hydrogen fluoride or ammonia peroxide mixture may be used as an etchant.

An insulating layer 766 is formed to cover the conductive layers 763 to 765. In order to obtain the insulating layer 766, a single layer or stacked layers are formed by a known method (SOG, droplet discharging, or the like) using an inorganic material or an organic material. The insulating layer 766 is preferably formed to have a thickness of 0.75 to 3 μm. Then, the insulating layer 766 is etched by photolithography, thereby forming openings 767 to 769 to expose the conductive layers 763 to 765.

Figure 7A:
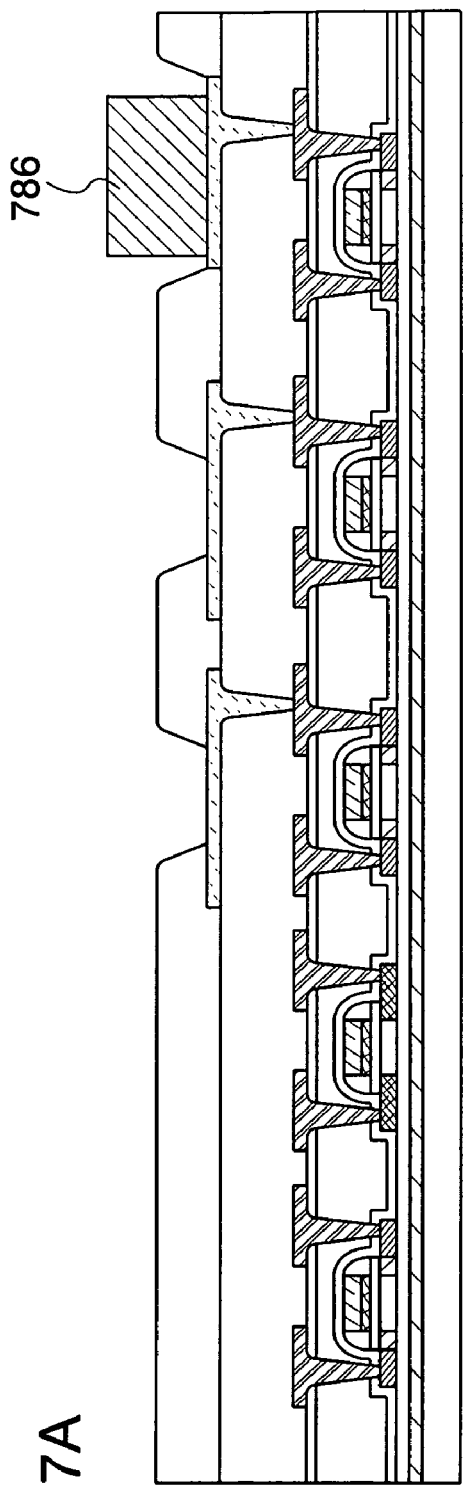
FIGS. 7A and 7B are diagrams each showing a manufacturing step of the semiconductor device of the invention.

A conductive layer 786 functioning as an antenna is formed in contact with the conductive layer 765 (see FIG. 7A). The conductive layer 786 is formed by a known method (plasma CVD, sputtering, printing, droplet discharging, or the like) using a conductive material. The conductive layer 786 is preferably formed of a single layer or stacked layers using an element selected from aluminum (Al), titanium (Ti), silver (Ag), and copper (Cu), or an alloy material or a compound material that mainly contains these elements.

Specifically, the conductive layer 786 is formed by screen printing using a paste containing silver and then applying heat treatment at a temperature of 50 to 350° C. Alternatively, the conductive layer 786 may be obtained by forming an aluminum layer by sputtering and then patterning the aluminum layer. The aluminum layer is preferably patterned by wet etching, and then subjected to heat treatment at a temperature of 200 to 300° C.

Figure 7B:
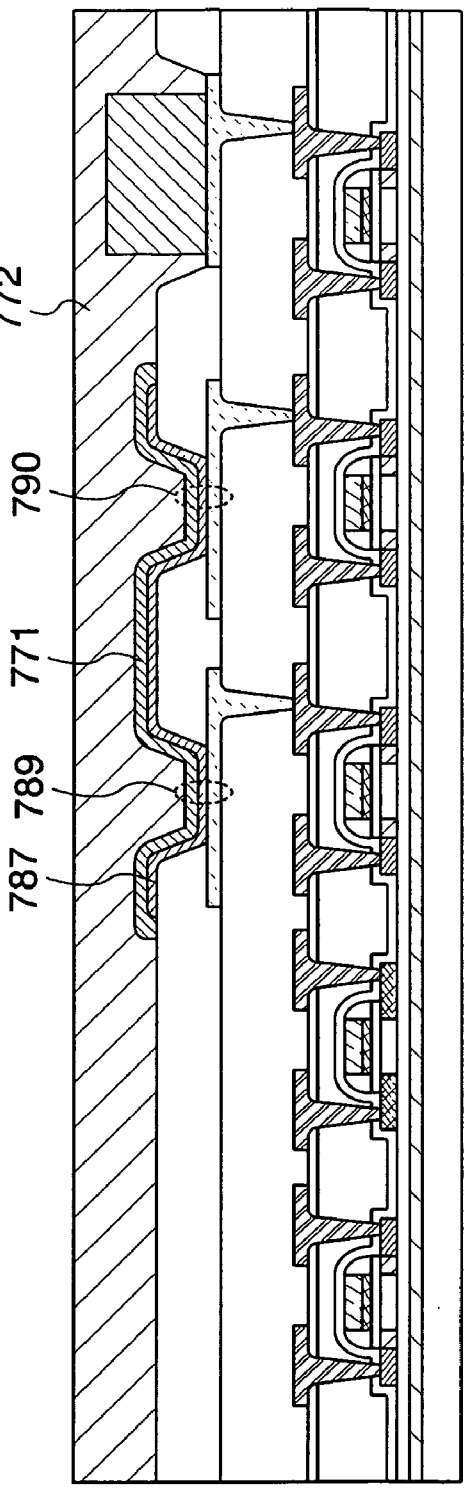

Subsequently, a layer 787 containing an organic compound is formed in contact with the conductive layers 763 and 764 (see FIG. 7B). The layer 787 containing an organic compound is formed by a known method (droplet discharging, vapor deposition, or the like). Then, a conductive layer 771 is formed in contact with the layer 787 containing an organic compound. The conductive layer 771 is formed by a known method (sputtering, vapor deposition, or the like).

Through the aforementioned steps, a memory element 789 formed by stacking the conductive layer 763, the layer 787 containing an organic compound, and the conductive layer 771; and a memory element 790 formed by stacking the conductive layer 764, the layer 787 containing an organic compound, and the conductive layer 771 are completed.

In the aforementioned steps, since the layer 787 containing an organic compound does not have high heat resistance, the step of forming the layer 787 containing an organic compound is performed after the step of forming the conductive layer 786 functioning as an antenna.

Subsequently, an insulating layer 772 functioning as a protective layer is formed by a known method (SOG, droplet discharging, or the like) so as to cover the memory elements 789 and 790 and the conductive layer 786 functioning as an antenna. The insulating layer 772 is formed of a layer containing carbon such as DLC (Diamond Like Carbon), a layer containing silicon nitride, a layer containing silicon nitride oxide, or an organic material (preferably, an epoxy resin).

Figure 8A:
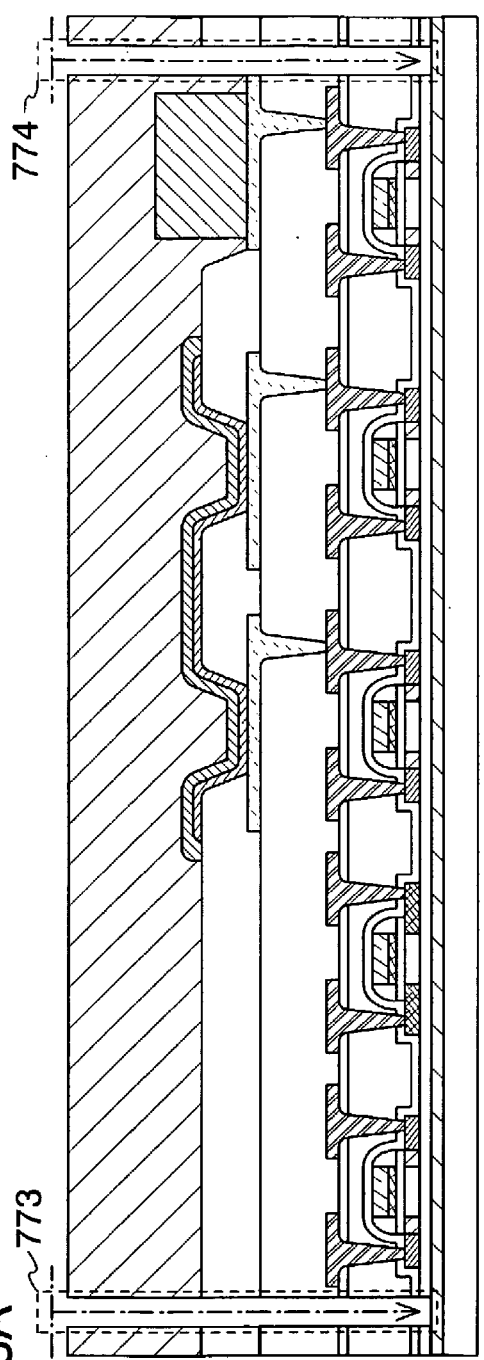
FIGS. 8A and 8B are diagrams each showing a manufacturing step of the semiconductor device of the invention.

The insulating layers 703, 749, 750, 751, 762, and 766 are etched by photolithography so as to expose the separation layer 702, thereby forming openings 773 and 774 (see FIG. 8A).

Figure 8B:
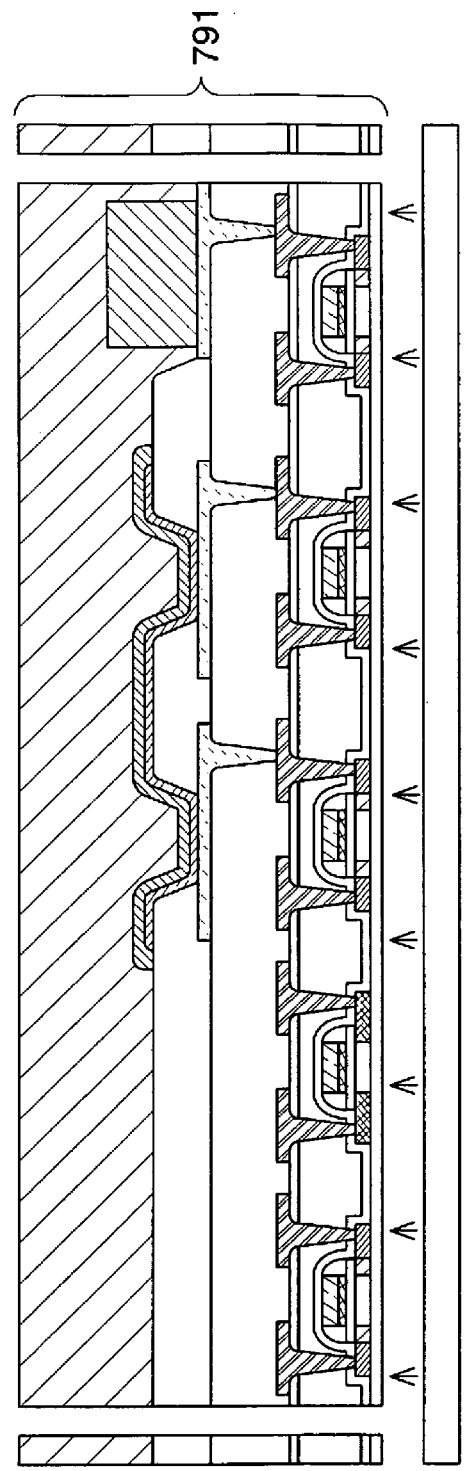

Then, an etchant is put in the openings 773 and 774 to remove the separation layer 702 (see FIG. 8B). A gas or liquid containing halogen fluoride is used as the etchant. For example, chlorine trifluoride ($ClF_3$), nitrogen trifluoride ($NF_3$), bromine trifluoride ($BrF_3$), or hydrogen fluoride (HF) is used as the etchant. It is to be noted that if hydrogen fluoride is used as the etchant, the separation layer 702 is formed of silicon oxide.

Through the aforementioned steps, a thin film integrated circuit 791, which includes the thin film transistors 744 to 748, an element group of the memory elements 789 and 790, and the conductive layer 786 functioning as an antenna, is separated from the substrate 701.

The substrate 701 separated from the thin film integrated circuit 791 is preferably reused for cost reduction. The insulating layer 772 is formed to prevent the thin film integrated circuit 791 from scattering after the separation layer 702 is removed. Since the thin film integrated circuit 791 is small, thin and lightweight, it easily scatters as it is not tightly attached to the substrate 701 after the separation layer 702 is removed. However, by forming the insulating layer 772 over the thin film integrated circuit 791, the weight of the thin film integrated circuit 791 increases and thus the scattering of the thin film integrated circuit 791 from the substrate 701 can be prevented. The thin film integrated circuit 791 itself is thin and lightweight; however, by forming the insulating layer 772, the thin film integrated circuit 791 is not rolled and can have a certain degree of strength.

Figure 9:
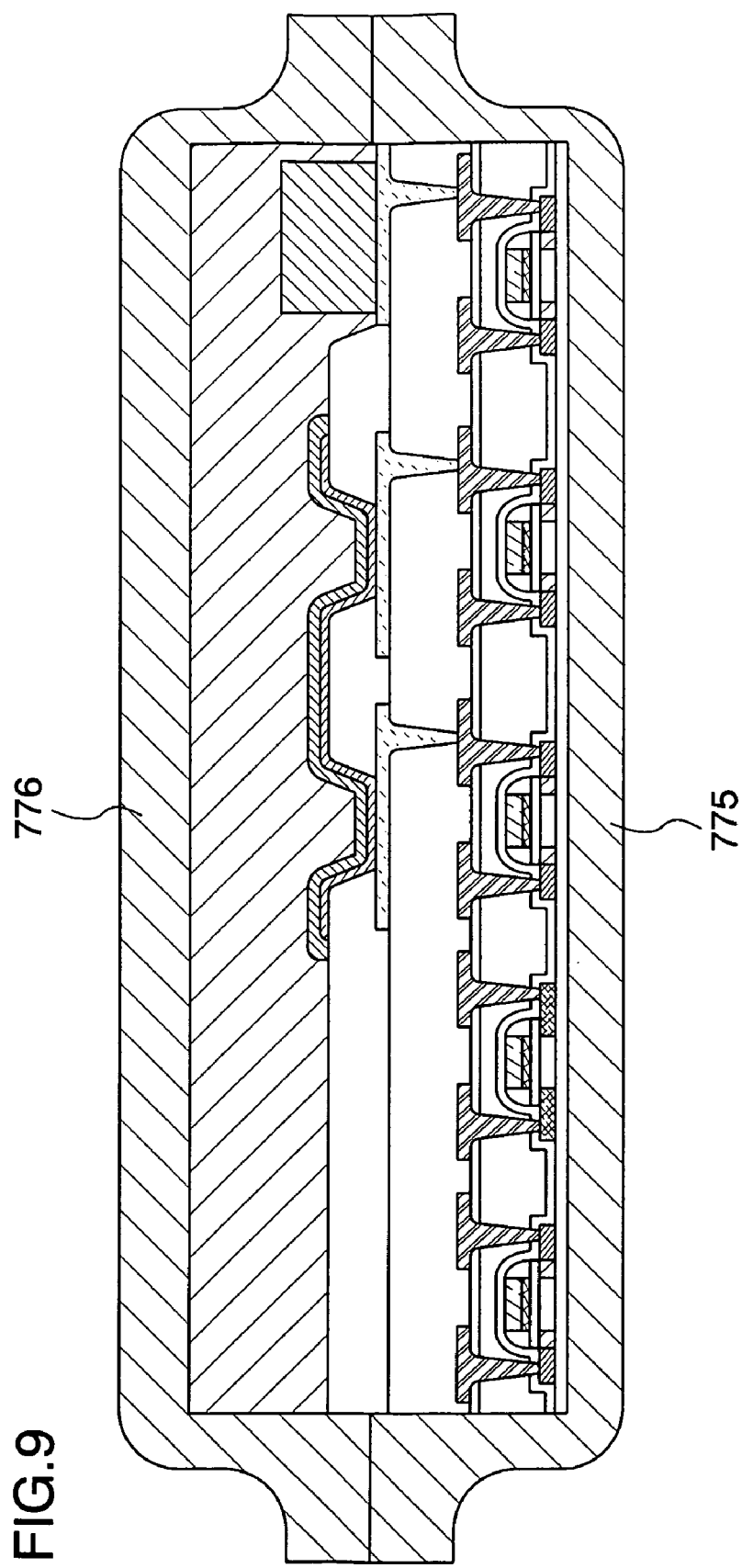
FIG. 9 is a diagram showing a manufacturing step of the semiconductor device of the invention.

Next, one surface of the thin film integrated circuit 791 is attached to a first substrate 776 and completely separated from the substrate 701 (see FIG. 9). Then, the other surface of the thin film integrated circuit 791 is attached to a second substrate 775, and the thin film integrated circuit 791 is sealed with the first substrate 776 and the second substrate 775 by applying one or both of heat treatment and pressure treatment.

Each of the first substrate 776 and the second substrate 775 corresponds to a film made of polypropylene, polyester, vinyl, polyvinyl fluoride, polyvinyl chloride, or the like, paper of a fibrous material, a stacked film of a base film (polyester, polyamide, an inorganic vapor deposited film, paper, or the like) and an adhesive synthetic resin film (an acrylic-based synthetic resin, an epoxy-based synthetic resin, or the like), and the like. The film is attached to a subject by heat treatment and pressure treatment. In performing the heat treatment and the pressure treatment, an adhesive layer that is provided on the outermost surface of the film, or a layer (not an adhesive layer) that is provided on the outermost surface of the film and melted by heat treatment is attached by applying pressure.

Adhesive layers may be provided over the surface of the first substrate 776 and the second substrate 775, or not. Each adhesive layer corresponds to a layer containing an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, and an acrylic resin-based adhesive.

If each of the first substrate 776 and the second substrate 775 is formed of plastic, it can be easily processed into a good design and flexible shape as plastic is thin and lightweight and can be bent. In addition, a plastic substrate has high impact resistance and can be easily attached to and incorporated in various products, leading to applications in various fields.

In the aforementioned structure, the memory elements 789 and 790 are each an element where a layer containing an organic compound is provided between a pair of conductive layers. Data is written to the memory elements 789 and 790 when the pair of conductive layers thereof are short circuited. Meanwhile, data is read from the memory elements 789 and 790 by reading the difference of the resistance of them. Such memory elements 789 and 790 are characterized in that they are non-volatile, data thereof cannot be rewritten, and data can be written thereto if data has not been written yet. Further, the memory elements 789 and 790 can be easily manufactured since each of them has a three-layer stacked structure. In addition, the area of the stacked portion can be easily reduced, and it is thus easy to achieve high integration.

Embodiment 3

Figure 10A:
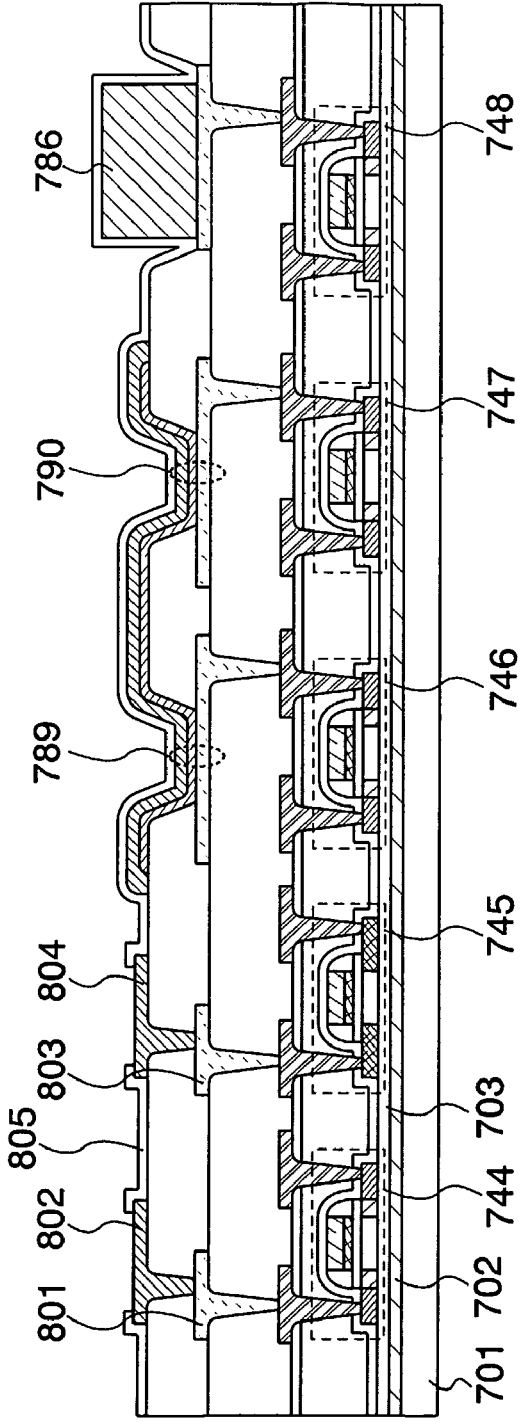
FIGS. 10A and 10B are diagrams each showing a manufacturing step of the semiconductor device of the invention.

A manufacturing method of a semiconductor device of the invention is described with reference to FIGS. 10A and 10B and FIG. 11.

The thin film transistors 744 to 748, the memory elements 789 and 790, and the conductive layer 786 functioning as an antenna are provided over the substrate 701. The steps for forming these elements are the same as the steps shown in FIGS. 5A to 7B, except in that conductive layers 801, 802, 803, and 804 are additionally provided. Therefore, description thereof is omitted (see FIG. 10A).

An insulating layer 805 is formed to cover the plurality of elements. Then, the insulating layer 805 is selectively removed so as to expose a part of the conductive layers 802 and 804.

Figure 10B:
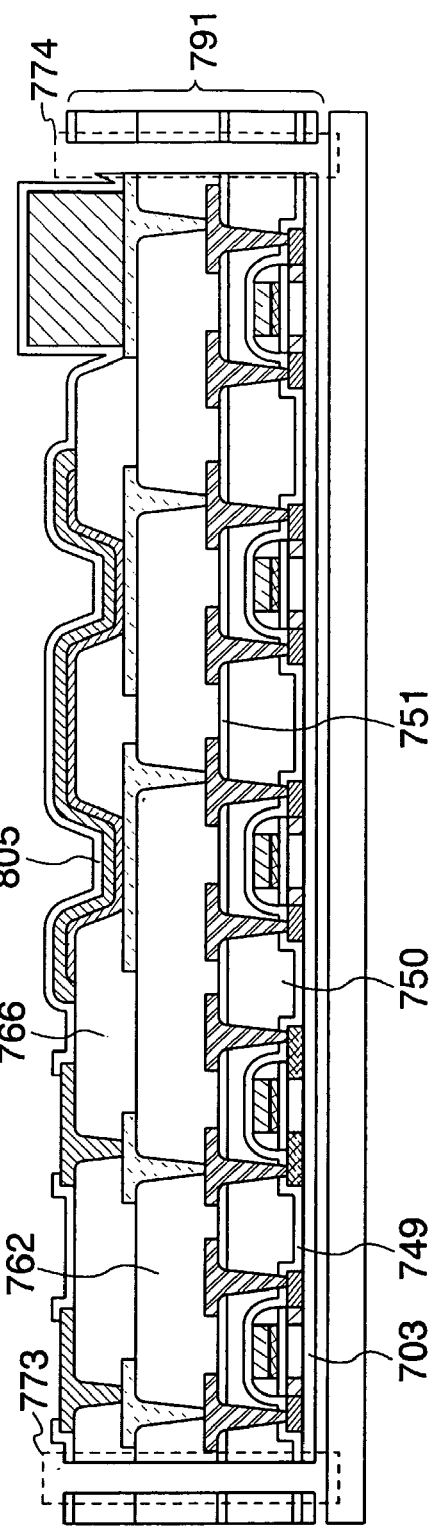
Figure 11:
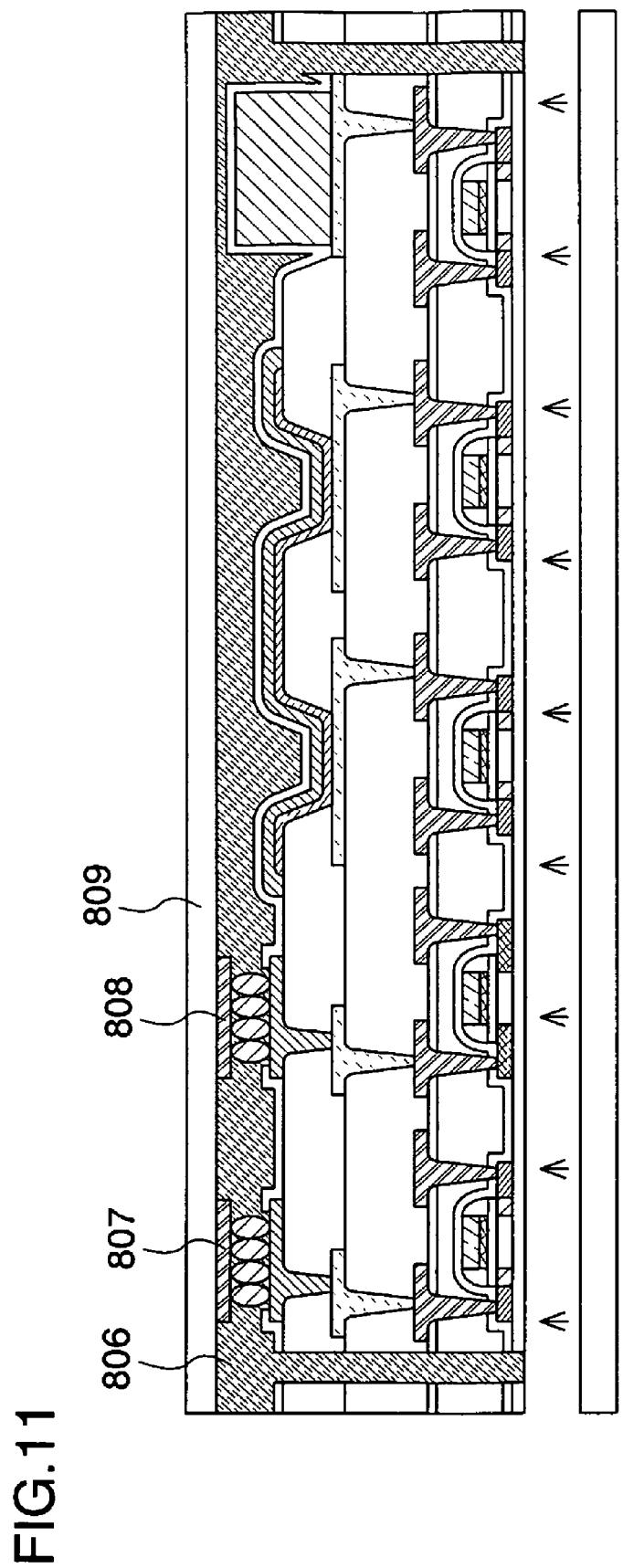
FIG. 11 is a diagram showing a manufacturing step of the semiconductor device of the invention.

The insulating layers 703, 749, 750, 751, 762, 766, and 805 are etched by photolithography so as to expose the separation layer 702, thereby forming the openings 773 and 774 (see FIG. 10B). Subsequently, an etchant is put in the openings 773 and 774 to remove the separation layer 702.

With an anisotropic conductive paste 806, the thin film integrated circuit 791 is attached to a substrate 809. Then, the thin film integrated circuit 791 is separated from the substrate 701 (see FIG. 11).

It is to be noted that when the thin film integrated circuit 791 is attached to the substrate 809, the conductive layer 802 is electrically connected to the conductive layer 807, and the conductive layer 804 is electrically connected to the conductive layer 808. The substrate 809 includes a pixel circuit for displaying images and other arithmetic circuits, and these circuits are electrically connected to the conductive layers 807 and 808.

Embodiment 4

A manufacturing method of a semiconductor device of the invention is described with reference to FIGS. 12A, 12B, 13A, and 13B.

The thin film transistors 744 to 748, the memory elements 789 and 790, and the conductive layer 786 functioning as an antenna are provided over the substrate 701. The steps for forming these elements are the same as the steps shown in FIGS. 5A to 7B, except in that conductive layers 821 and 822 are additionally provided; therefore, description thereof is omitted (see FIG. 12A). The conductive layer 821 is connected to the source electrode or the drain electrode of the thin film transistor 744, and is in contact with the substrate 701. The conductive layer 822 is connected to the source electrode or the drain electrode of the thin film transistor 745, and is in contact with the substrate 701.

The insulating layers 703, 749, 750, 751, 762, 766, and 772 are etched by photolithography so as to expose the separation layer 702, thereby forming the openings 773 and 774 (see FIG. 12B). Subsequently, an etchant is put in the openings 773 and 774 to remove the separation layer 702.

Figure 13A:
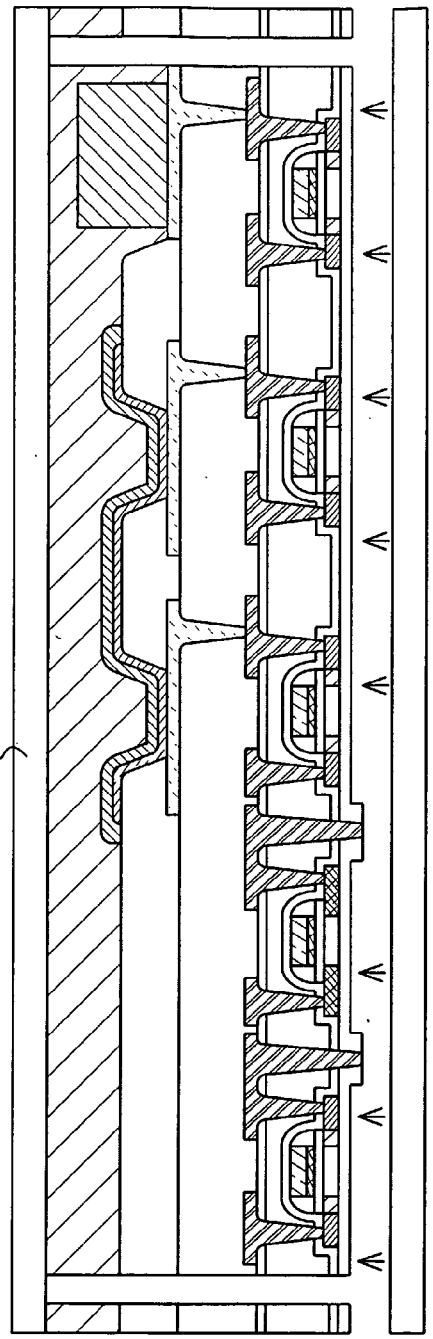
FIGS. 13A and 13B are diagrams each showing a manufacturing step of the semiconductor device of the invention.
Figure 13B:
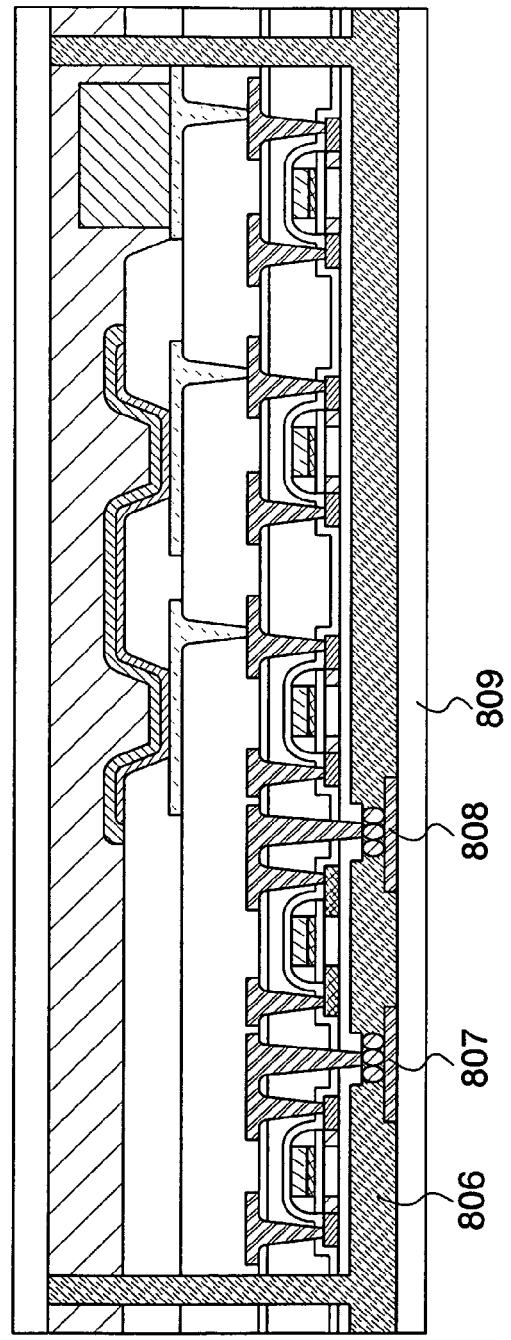
Figure 14A:
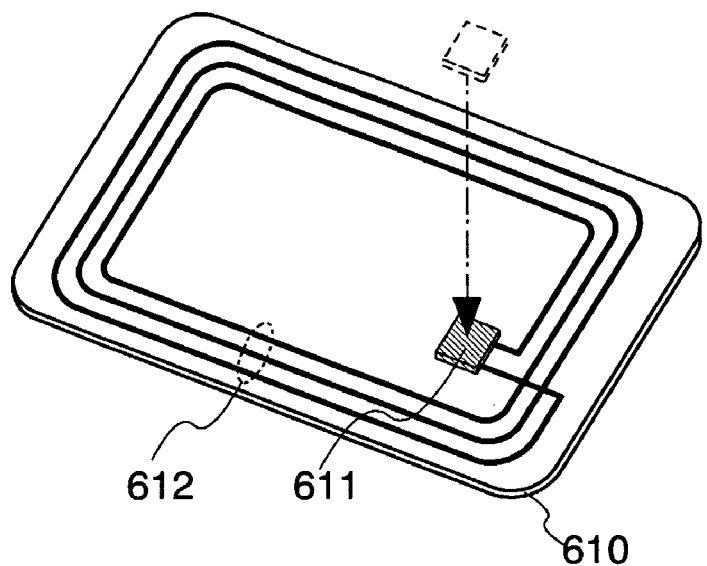
FIGS. 14A to 14D are diagrams each showing a configuration of the semiconductor device of the invention.
Figure 14B:
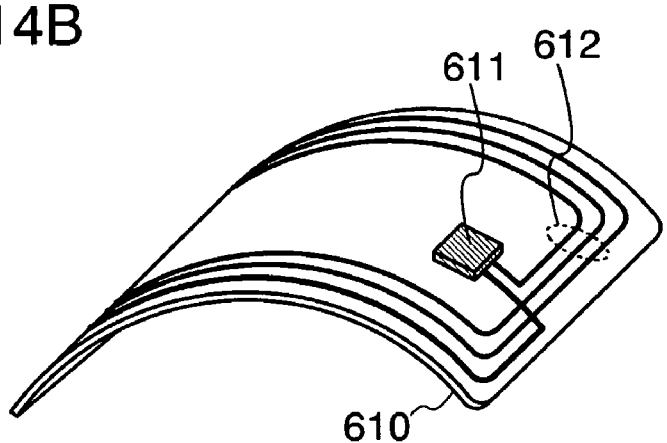
Figure 14C:
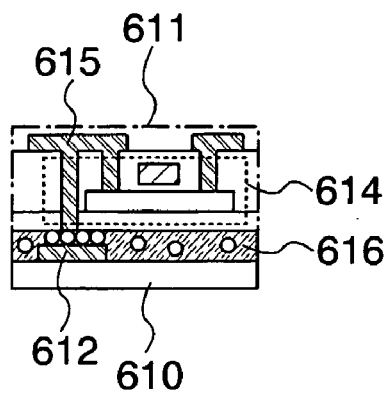
Figure 14D:
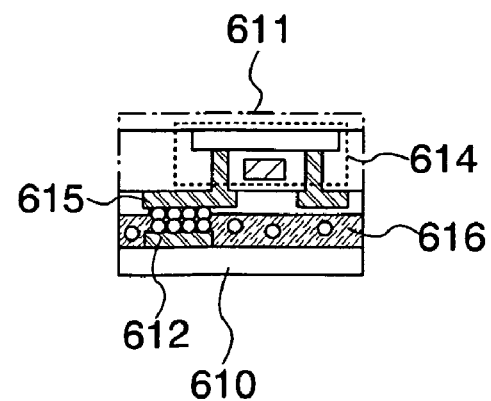

A substrate 825 is attached to one surface of the thin film integrated circuit 791, and the thin film integrated circuit 791 is separated from the substrate 701 (see FIG. 13A). Then, the other surface of the thin film integrated circuit 791 is attached to the substrate 809 including the conductive layers 807 and 808 with the anisotropic conductive paste 806 (see FIG. 13B). The substrate 809 includes, for example, a pixel portion for displaying images and other arithmetic circuits, and the conductive layers 807 and 808 are electrically connected to the pixel portion and the arithmetic circuits.

Embodiment 5

A semiconductor device of the invention corresponds to an RFID, an IC tag, a wireless chip, an electronic tag, and the like, and the semiconductor device of the invention can be applied to an IC card. An IC card using the semiconductor device of the invention is described below with reference to FIGS. 14A to 14D.

In the IC card, a thin film integrated circuit 611 is attached onto a substrate 610 over which a conductive layer 612 functioning as an antenna is provided. The conductive layer 612 over the substrate 610 and a conductive layer 615 that is connected to a thin film transistor 614 constituting the thin film integrated circuit 611 are electrically connected to each other with an anisotropic conductive paste 616 (see FIGS. 14C and 14D). The substrate 610 is preferably formed of plastic. According to this, the substrate 610 can be easily processed into a good design and flexible shape as plastic is thin and lightweight and can be bent (see FIG. 14B). In addition, an IC card having high impact resistance can be provided.

The thin film integrated circuit 611 may include one or more of an instruction analyzing circuit, a memory control circuit, a memory circuit, a power supply circuit, a demodulating circuit, and a modulating circuit as well as the asynchronous counter described in the aforementioned embodiment mode. The IC card transmits or receives electromagnetic waves to or from a reader/writer through the conductive layer 612 functioning as an antenna.

Embodiment 6

Figure 15A:
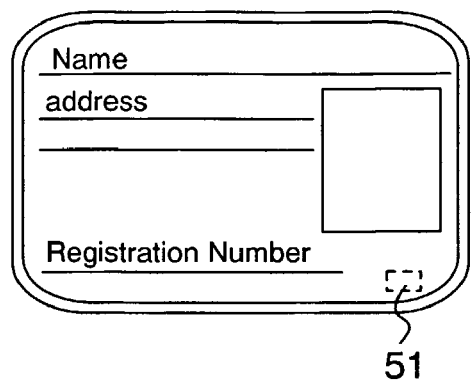
FIGS. 15A to 15E are diagrams each showing a configuration of the semiconductor device of the invention.
Figure 15B:
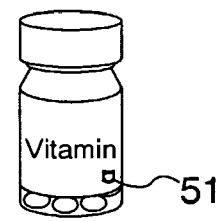
Figure 15C:
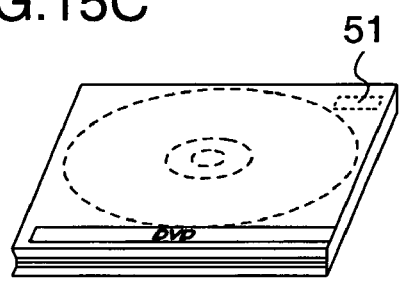
Figure 15D:
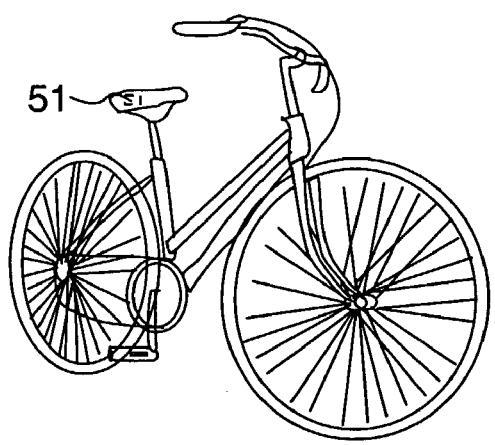
Figure 15E:
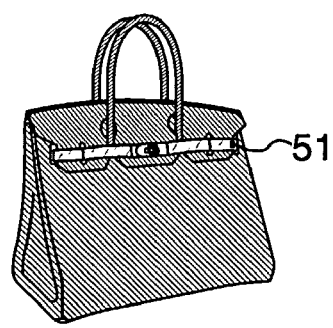

A semiconductor device of the invention can be widely used by utilizing the function of transmitting and receiving electromagnetic waves. For example, a semiconductor device 51 may be attached to or incorporated in paper, coins, securities, bearer bonds, certificates (driving license, resident card, or the like, see FIG. 15A), books, packaging containers (wrapping paper, bottles, or the like, see FIG. 15B), recording media (DVD software, video tapes, or the like, see FIG. 15C), vehicles (bicycle or the like, see FIG. 15D), accessories (bags, glasses, or the like, see FIG. 15E), food items, clothes, livingware, electronic apparatuses (liquid crystal display device, EL display device, television set, portable terminal, or the like), and the like.

The semiconductor device is attached to the surface of or incorporated in, for example, bills, coins, or certificates. The semiconductor device is also attached to or incorporated in the paper of the cover of a book, or an organic resin of a packaging container. In addition, when an identification number is stored in a memory circuit included in a semiconductor device so that the semiconductor device has an identification function, the application range of the semiconductor device can be further increased. When the semiconductor device of the invention is applied to, for example, a product management system, an identification system, a distribution system, or the like, a system with high function, multifunction, and high added value can be achieved. This embodiment may be freely combined with the aforementioned embodiment mode and embodiments.

This application is based on Japanese Patent Application serial No. 2005-088027 filed in Japan Patent Office on Mar. 25, 2005, the entire contents of which are hereby incorporated by reference.

The invention claimed is:

1. A semiconductor device comprising:
    an antenna configured to convert a carrier wave into an electrical signal;
    an asynchronous counter including a plurality of flip-flop circuits; and
    a circuit configured to generate a power supply voltage using the electrical signal and configured to supply the generated power supply voltage to the asynchronous counter,
    wherein each of the plurality of flip-flop circuits comprises a plurality of thin film transistors, and
    wherein a period from the time when a signal is inputted to an input terminal of a flip-flop circuit at one end of the plurality of flip-flop circuits to the time when a signal is outputted from an output terminal of a flip-flop circuit at the other end of the plurality of flip-flop circuits is longer than one cycle of the carrier wave.

2. A semiconductor device comprising:
    an antenna configured to convert a carrier wave into an electrical signal;
    an asynchronous counter including a plurality of flip-flop circuits; and
    a circuit configured to generate a power supply voltage using the electrical signal and configured to supply the generated power supply voltage to the asynchronous counter,
    wherein each of the plurality of flip-flop circuits comprises a plurality of transistors each including a channel portion formed of single crystal silicon,
    wherein a period from the time when a signal is inputted to an input terminal of a flip-flop circuit at one end of the plurality of flip-flop circuits to the time when a signal is outputted from an output terminal of a flip-flop circuit at the other end of the plurality of flip-flop circuits is longer than one cycle of the carrier wave, and
    wherein each of the plurality of transistors has a channel length of 0.5 to 50 µm.

3. A semiconductor device comprising:
    an antenna configured to convert a carrier wave into an electrical signal;
    an asynchronous counter including a plurality of flip-flop circuits; and
    a circuit configured to generate a power supply voltage using the electrical signal and configured to supply the generated power supply voltage to the asynchronous counter,
    wherein each of the plurality of flip-flop circuits comprises a plurality of thin film transistors,
    wherein a period from the time when a signal is inputted to an input terminal of a flip-flop circuit at one end of the plurality of flip-flop circuits to the time when a signal is outputted from an output terminal of a flip-flop circuit at the other end of the plurality of flip-flop circuits is longer than one cycle of the carrier wave, and wherein each of the plurality of thin film transistors has a channel length of 3 to 100 μm.

4. The semiconductor device according to claim 1, wherein the asynchronous counter operates at a frequency of 1 to 100 MHz.

5. The semiconductor device according to claim 1 or 2, wherein a frequency of the carrier wave is 860 to 960 MHz or 1 to 5 GHz.

6. The semiconductor device according to claim 3, wherein a frequency of the carrier wave is 13.56 MHz.

7. The semiconductor device according to claim 1 or 3, wherein the circuit comprises the plurality of thin film transistors.

8. The semiconductor device according to claim 1 or 3, wherein the antenna, the asynchronous counter and the circuit are provided over a same insulating surface.

9. The semiconductor device according to claim 1 or 3, further comprising a demodulating circuit for demodulating the electrical signal, wherein the demodulating circuit comprises the asynchronous counter.

10. The semiconductor device according to claim 1 or 3, further comprising:

a demodulating circuit for demodulating the electrical signal; and an instruction analyzing circuit for analyzing a signal demodulated by the demodulating circuit, wherein one or both of the demodulating circuit and the instruction analyzing circuit comprise the asynchronous counter.

11. The semiconductor device according to claim 1 or 3, further comprising a modulating circuit for modulating a load of the antenna, wherein the modulating circuit comprises the asynchronous counter.

12. The semiconductor device according to claim 1 or 3, further comprising:

a memory circuit including a plurality of memory elements for storing data; and a control circuit for controlling writing and reading of data to and from the memory circuit, wherein one or both of the memory circuit and the control circuit comprises the asynchronous counter.

13. The semiconductor device according to claim 1 or 3, further comprising:

a memory circuit including a plurality of memory elements for storing data;

a control circuit for controlling writing and reading of data to and from the memory circuit;

a modulating circuit for modulating a load of the antenna; and a memory control circuit for supplying data stored in the memory circuit to the modulating circuit, wherein one or more of the memory circuit, the control circuit, the modulating circuit, and the memory control circuit comprise the asynchronous counter.

\* \* \* \* \*